United States Patent
Saito et al.

(10) Patent No.: US 12,126,352 B2
(45) Date of Patent: Oct. 22, 2024

(54) SEMICONDUCTOR DEVICE AND CONTROL METHOD FOR THE SAME

(71) Applicant: Renesas Electronics Corporation, Tokyo (JP)

(72) Inventors: Wataru Saito, Tokyo (JP); Fukashi Morishita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 182 days.

(21) Appl. No.: 17/978,266

(22) Filed: Nov. 1, 2022

(65) Prior Publication Data
US 2023/0138391 A1  May 4, 2023

(30) Foreign Application Priority Data
Nov. 1, 2021  (JP) .................. 2021-178797

(51) Int. Cl.
*H03M 1/10* (2006.01)
*H03M 1/68* (2006.01)
*H04N 23/45* (2023.01)
*H04N 25/69* (2023.01)
*H04N 25/78* (2023.01)

(52) U.S. Cl.
CPC .......... *H03M 1/1071* (2013.01); *H04N 23/45* (2023.01); *H04N 25/69* (2023.01); *H04N 25/78* (2023.01); *H03M 1/68* (2013.01)

(58) Field of Classification Search
CPC ...... H03M 1/1071; H03M 1/68; H04N 23/45; H04N 25/69; H04N 25/78

USPC .......................................... 341/120, 144, 155
See application file for complete search history.

(56) References Cited

U.S. PATENT DOCUMENTS

| | | | | |
|---|---|---|---|---|
| 7,872,645 B2 * | 1/2011 | Myers | .................... | H04N 25/69 348/308 |
| 8,803,979 B2 * | 8/2014 | Solhusvik | .............. | H04N 25/78 348/181 |
| 2020/0244908 A1 | 7/2020 | Matsumoto et al. | | |

FOREIGN PATENT DOCUMENTS

JP  2020120310 A  8/2020

* cited by examiner

*Primary Examiner* — Khai M Nguyen
(74) *Attorney, Agent, or Firm* — SCULLY, SCOTT, MURPHY & PRESSER, P.C.

(57) ABSTRACT

A semiconductor device includes a digital-analog converter provided with a plurality of current cells, and a test circuit electrically connected to the digital-analog converter to test the digital-analog converter. The test circuit includes: a charge information holding circuit that holds, as differential charge information, a difference value between a first charge according to a first current and a second charge according to a second current by at least one or more current cells among the plurality of current cells; a reference voltage generation circuit that generates a reference voltage to be comparative object; and a comparison circuit that compares a determination voltage according to the differential charge information and the reference voltage to output a comparison result.

8 Claims, 26 Drawing Sheets

SEMICONDUCTOR DEVICE AND CONTROL METHOD FOR THE SAME

CROSS-REFERENCE TO RELATED APPLICATION

The present application claims priority from Japanese Patent Application No. 2021-178797 filed on Nov. 1, 2021, the content of which is hereby incorporated by reference into this application.

BACKGROUND

The present disclosure relates to a semiconductor device, in particular, a semiconductor device having a digital-analog converter.

A digital camera captures a subject with a lens and forms an optical image on a solid-state image sensor. There are broadly two types of a CCD (Charge Coupled Device) image sensor and a CMOS (Complementary Metal Oxide Semiconductor) image sensor in this solid-state image sensor. From the viewpoint of making a camera high performance, attention is being paid to the CMOS image sensor that is easy to mount a CMOS circuit for image processing as a peripheral circuit. The CMOS image sensor includes an analog image sensor and a digital image sensor. Both have advantages and disadvantages, but there are high expectations for the digital image sensor from the viewpoint of a data processing speed.

The digital image sensor is provided with an A/D (Analog-to-Digital) converter for each column of a pixel array (see Patent Document 1 (Japanese patent application laid-open No. 2020-120310)).

SUMMARY

In this respect, in order to design a high-sensitivity A/D converter, an output voltage of the high-accuracy D/A converter for being compared with a voltage of an analog pixel signal is important. For that purpose, the output voltage of the D/A converter needs to be tested. However, due to an influence of a fluctuation (noise component) of a fixed voltage inside a chip even when a highly accurate external power supply is used as a reference voltage for test, the above-mentioned test may not be conducted (performed) correctly since the noise component is not canceled.

The present disclosure provides a semiconductor device, which can conduct a highly accurate test, for a D/A converter and a control method for the same.

The other problems and novel characteristics of the present invention will be apparent from the description of the present specification and the accompanying drawings.

According to one embodiment, a semiconductor device has a digital-analog converter provided with a plurality of current cells, and a test circuit electrically connected to the digital-analog converter, and testing the digital-analog converter. The test circuit includes: a charge information holding circuit holding, as differential charge information, a difference value between a first charge according to a first current and a second charge according to a second current by at least one or more current cells among the plurality of current cells; a reference voltage generation circuit generating a reference voltage to be comparative object; and a comparison circuit comparing a determination voltage according to the differential charge information with the reference voltage to output a comparison result.

According to one embodiment, a control method for a semiconductor device is a control method for a semiconductor device including a digital-analog converter provided with a plurality of current cells and a test circuit electrically connected to the digital-analog converter to test the digital-analog converter. The above-mentioned control method includes: a step of holding, as differential charge information, a difference value between a first charge according to a first current and a second charge according to a second current by at least one or more current cells among the plurality of current cells; a step of generating a reference voltage to be comparative object; and a step of comparing a determination voltage according to the differential charge information with the reference voltage to output a comparison result.

According to one embodiment, for the D/A converter, the highly accurate test can be conducted.

DETAILED DESCRIPTION

Figure 1:
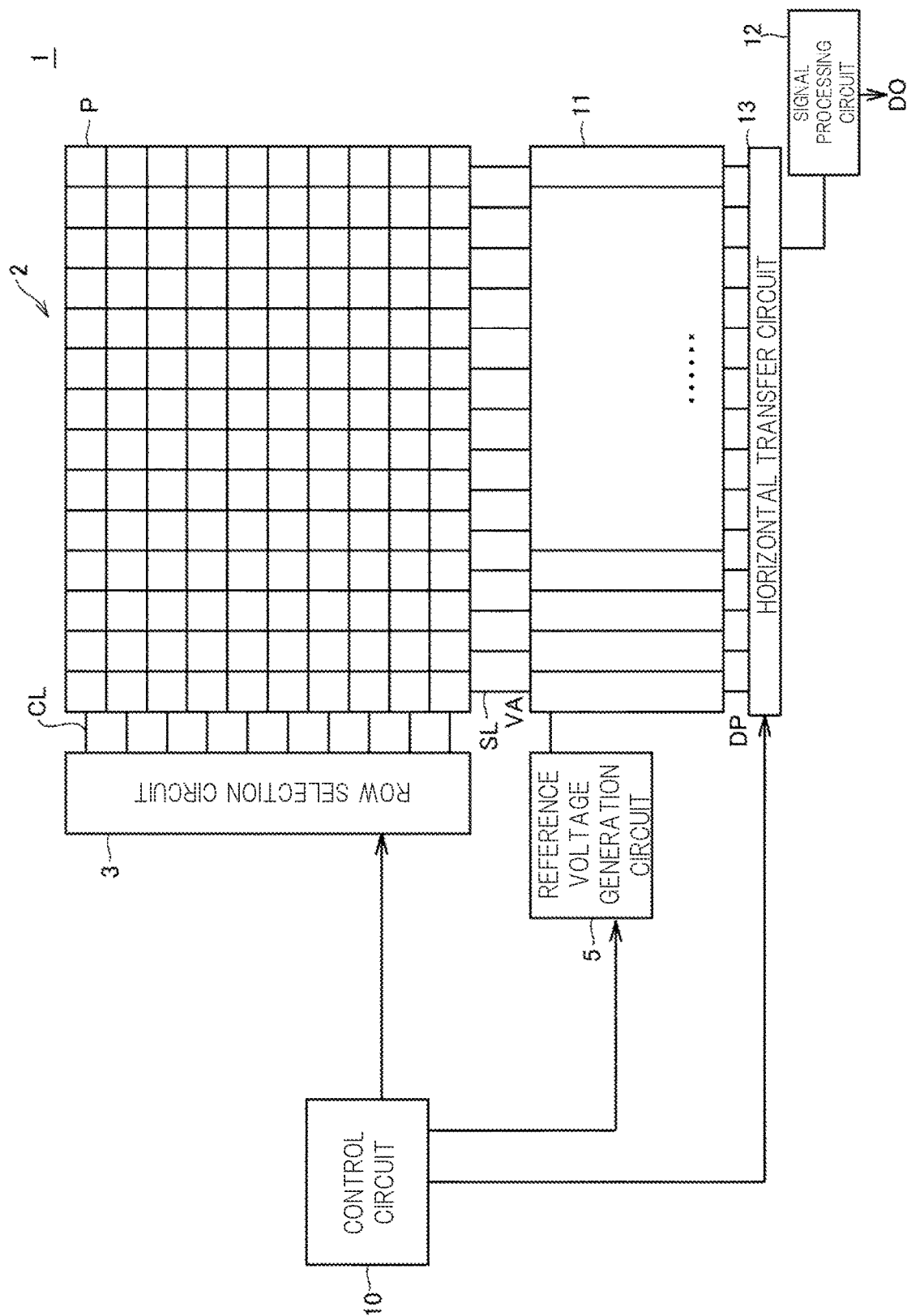
FIG. 1 is a diagram for explaining a configuration of an imaging device 1 based on an embodiment.

Embodiments of the present disclosure will be detailed with reference to the drawings. Incidentally, the same or corresponding parts in the drawings are denoted by the same reference numerals, and a description thereof will not be repeated.

FIG. 1 is a diagram for explaining an imaging device 1 based on an embodiment.

With reference to FIG. 1, an imaging device 1 according to an embodiment is a semiconductor device formed on a semiconductor substrate and, as shown in FIG. 1, includes a pixel array 2, a row selection circuit 3, and a control circuit 10.

The pixel array 2 includes a plurality of pixel circuits P arranged in a plurality of rows and a plurality of columns, a plurality of control lines respectively provided so as to correspond to the plurality of rows, and a plurality of signal lines respectively provided so as correspond to the plurality of columns. Each pixel circuit P outputs a sampling pixel signal VA having a voltage that corresponds to an amount of incident light. Each pixel circuit P is connected to the control line CL in the corresponding row and the signal line SL in the corresponding column. The plurality of control lines CL are connected to the row selection circuit 3.

The row selection circuit 3 is controlled by the control circuit 10, sequentially selects the plurality of rows one by one, and makes the control line CL of the selected row an activation level. Each pixel circuit P is activated in response to the corresponding control line CL being made the activation level, and outputs a sampling pixel signal VA of a voltage corresponding to the amount of incident light to the corresponding signal line SL. The control circuit 10 controls the entire imaging device.

Further, the imaging device 1 includes a reference voltage generation circuit 5, a plurality of A/D converters 11, a horizontal transfer circuit 13, and a signal processing circuit 12.

The reference voltage generation circuit 5 generates a reference voltage used by the plurality of A/D converters 11. The reference voltage is given to each of the plurality of A/D converters 11. The plurality of A/D converters 11 are respectively connected to a plurality of signal lines SL.

Each A/D converter 11 operates according to a control instruction from the control circuit 10, and converts a sampling pixel signal VA into plural-bit digital pixel signals DP, the pixel signal VA being outputted from the pixel circuit P activated by the row selection circuit 3 to the corresponding signal line SL.

Specifically, the A/D converter 11 executes A/D conversion of the sampling pixel signal VA into the plural-bit digital pixel signals DP based on the reference voltage VOUT which is a lamp signal.

In this example, a case where a 10-bit data signal is generated will be described. The horizontal transfer circuit 13 once holds the plurality of digital pixel signals DP for one line given from the plurality of A/D converters 11, and then sequentially transfers the plurality of held digital pixel signals DP one by one to a signal processing circuit 12.

The signal processing circuit 12 generates a 10-bit digital pixel signal DO based on the 10-bit digital pixel signal DP, and outputs the generated digital pixel signal DO outside.

Figure 2:
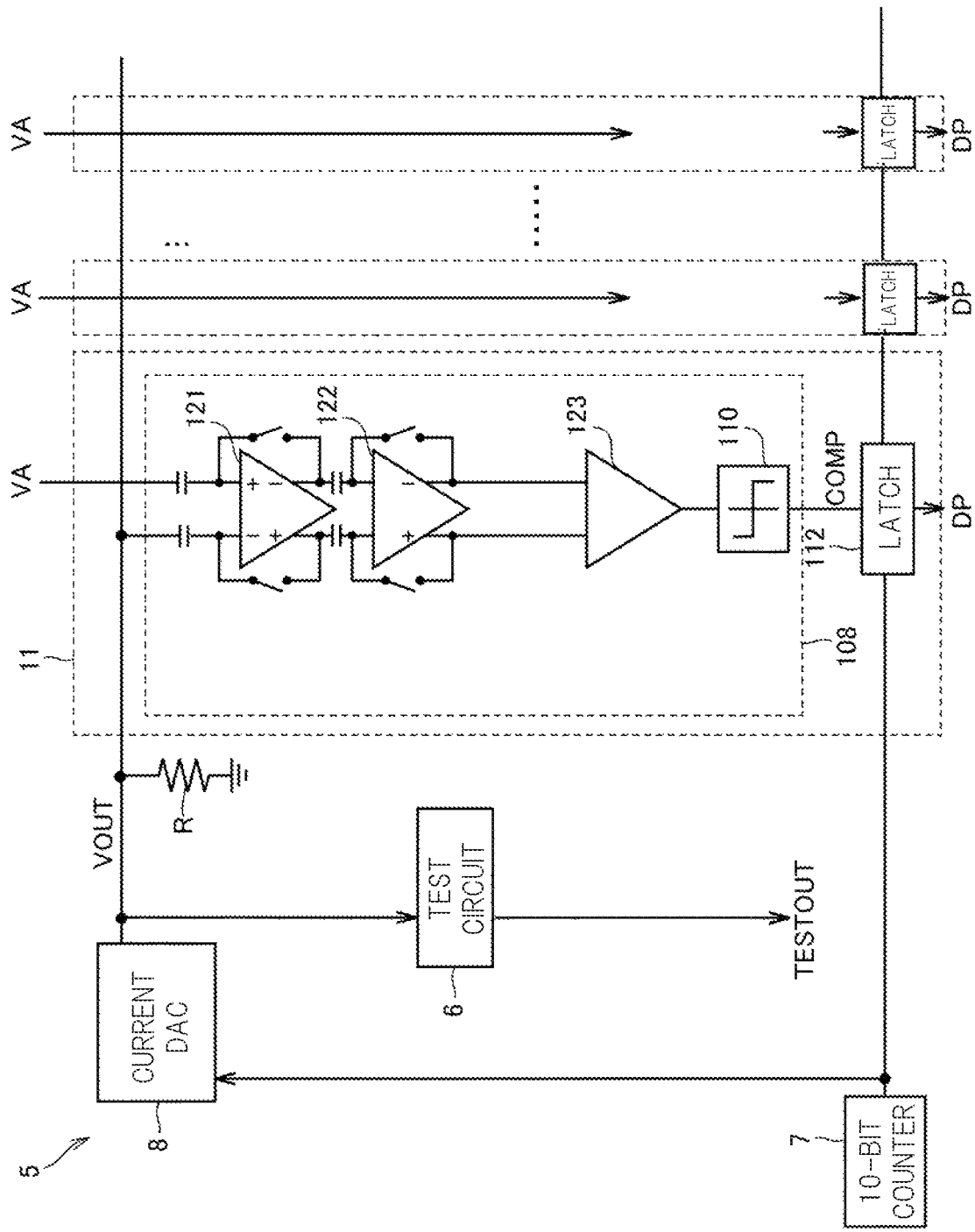
FIG. 2 is a block diagram showing each configuration of an A/D converter 11 and a reference voltage generation circuit 5 according to the embodiment.

FIG. 2 is a block diagram showing each configuration of the A/C converter 11 and the reference voltage generation circuit 5 according to the embodiment.

As shown in FIG. 2, the A/D converter 11 includes a comparison unit 108 and a latch 112. The comparison unit 108 includes a one or more-stage pre-amplifier and a binarization circuit 110. The comparison unit 108 compares a sampling pixel signal outputted from the pixel circuit P to the control line CL with the reference voltage VOUT which is a lamp signal. When the reference voltage VOUT, which is a lamp signal, is smaller, an output signal COMP thereof operates to output an L level. The latch 112 includes a latch that captures the output signal COMP from the binarization circuit 110, and a counter latch in which captured timing of the counter signal is controlled by an output of the comparison unit 108.

The 10-bit counter 7 is controlled by the control circuit 10 and is connected to the latch 112 of each AD converter 11. The bias circuit supplies a bias voltage to the pre-amplifier in the comparison unit 108.

In this example, the pre-amplifier has, for example, a three-stage configuration of a first amplifier 121, a second amplifier 122, and a third amplifier 123.

An input terminal of the first amplifier 121 and an output terminal of the first amplifier 121 are connected to an input terminal of the second amplifier 122 via a capacitor. An auto-zero operation that closes switches inserted between the input/output terminals of the first amplifier 121 and between the input/output terminals of the second amplifier 122 makes it possible to operate at the optimum operating point for each amplifier regardless of an external signal DC level.

The input terminal of the first amplifier 121 is connected to the control line CL from the pixel circuit P via a capacitor.

Consequently, a voltage of the sampling pixel signal VA of the control line CL is inputted to the above-mentioned input terminal.

The reference voltage VOUT is inputted to the other input terminal of the first amplifier 121 via a capacitor.

The comparison unit 108 may include a plurality of capacitors in addition to the second amplifier 122, the third amplifier 123, and the binarization circuit 110.

The output terminal of the first amplifier 121 is connected to the input terminal of the second amplifier 122 via a capacitor. The output terminal of the first amplifier 121 is connected to the input terminal of the second amplifier 122 via a capacitor. Consequently, the capacitor is arranged between the first amplifier 121 and the second amplifier 122. Thus, a power supply voltage of the first amplifier 121 and a power supply voltage of the second amplifier 122 may be different from each other. For example, the power supply voltage of the second amplifier 122 may be smaller than the power supply voltage of the first amplifier 121. Doing so makes it possible to reduce power consumption of the present embodiment.

The output terminal of the second amplifier 122 is connected to an input terminal of the third amplifier 123. An output terminal of the third amplifier 123 is inputted to the binarization circuit 110. Therefore, the third amplifier 123 is connected between the second amplifier 122 and the binarization circuit 110. The output terminal of the second amplifier 122 is connected to the binarization circuit 110 via the third amplifier 123.

The reference voltage generation circuit 5 includes a 10-bit counter 7, a current DAC 8, and a test circuit 6.

The reference voltage generation circuit 5 is controlled according to a control instruction from the control circuit 10. The 10-bit counter 7 is controlled by the control circuit 10 and is connected to the latch 112 of each AD conversion circuit. Although not shown, a bias circuit is provided to supply a bias voltage to the pre-amplifier in each comparison unit 108.

The current DAC 8 adjusts an amount of current flowing through the resistor R according to a signal from the 10-bit counter 7. A reference voltage VOUT, which is a lamp signal generated by the resistor R, is generated from the current DAC 8.

The comparison unit 108 compares a voltage of the sampling pixel signal VA and a voltage of the reference voltage VOUT about a high or low level, and outputs an output signal COMP indicating a comparison result.

The reference voltage VOUT, which is a lamp signal, decreases with a passage of time as explained in FIG. 3 described later.

Then, a time until output inversion of the output signal COMP of the binarization circuit 110 is measured. The latch 112 holds a counter value of the 10-bit counter 7 triggered by output determination of the output signal COMP. The 10-bit digital pixel signal DP corresponding to the sampling pixel signal VA is outputted according to the counter value held in the latch 112. Consequently, an analog-digital conversion processing of the sampling pixel signal VA is executed.

Figure 3:
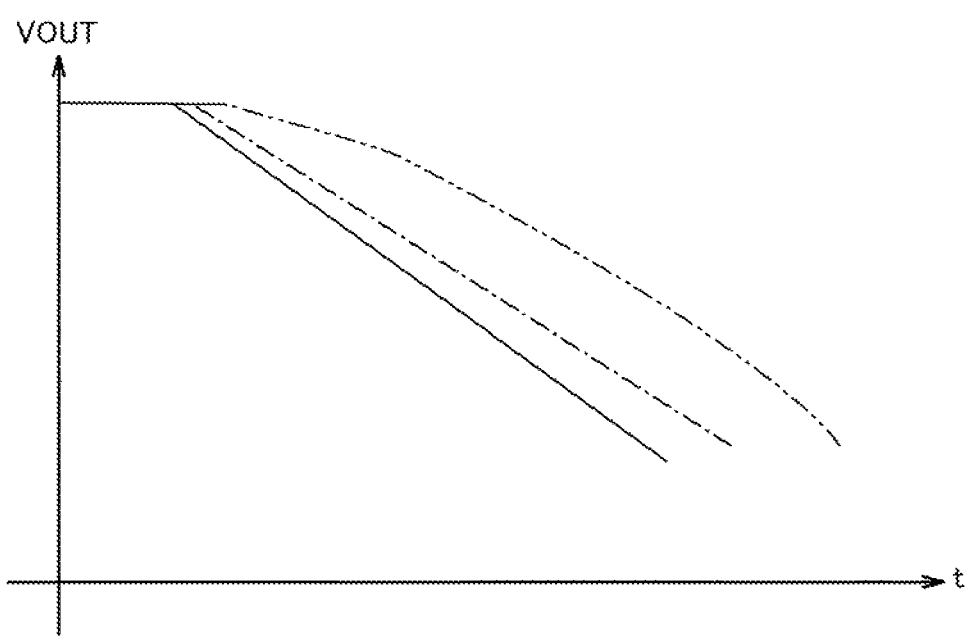
FIG. 3 is a diagram for explaining characteristics of a reference voltage VOUT which is a lamp signal according to the embodiment.

FIG. 3 is a diagram for explaining characteristics of the reference voltage VOUT, which is a lamp signal, according to the embodiment.

As shown in FIG. 3, the current DAC 8 adjusts an amount of current flowing through the resistor R according to a signal from the 10-bit counter 7, and the amount of current decreases with the passage of time.

In this example, three waveforms are shown, and a solid line is the reference voltage VOUT that is an ideal lamp signal. A dash-single-dot line or a dash-double-dot line is an actual reference voltage.

Due to sample variations, the solid line may deviate from the ideal lamp signal.

The test circuit 6 according to the embodiment conducts a test(s) in whether the reference voltage VOUT, which is a lamp signal, is appropriate. Specifically, it verifies variations of the reference voltage VOUT according to an output TESTOUT of the test circuit 6, and it determines whether the reference voltage VOUT is appropriate.

FIG. 4 is a diagram for explaining a configuration of a current DAC 8 according to the embodiment.

Figure 4A:
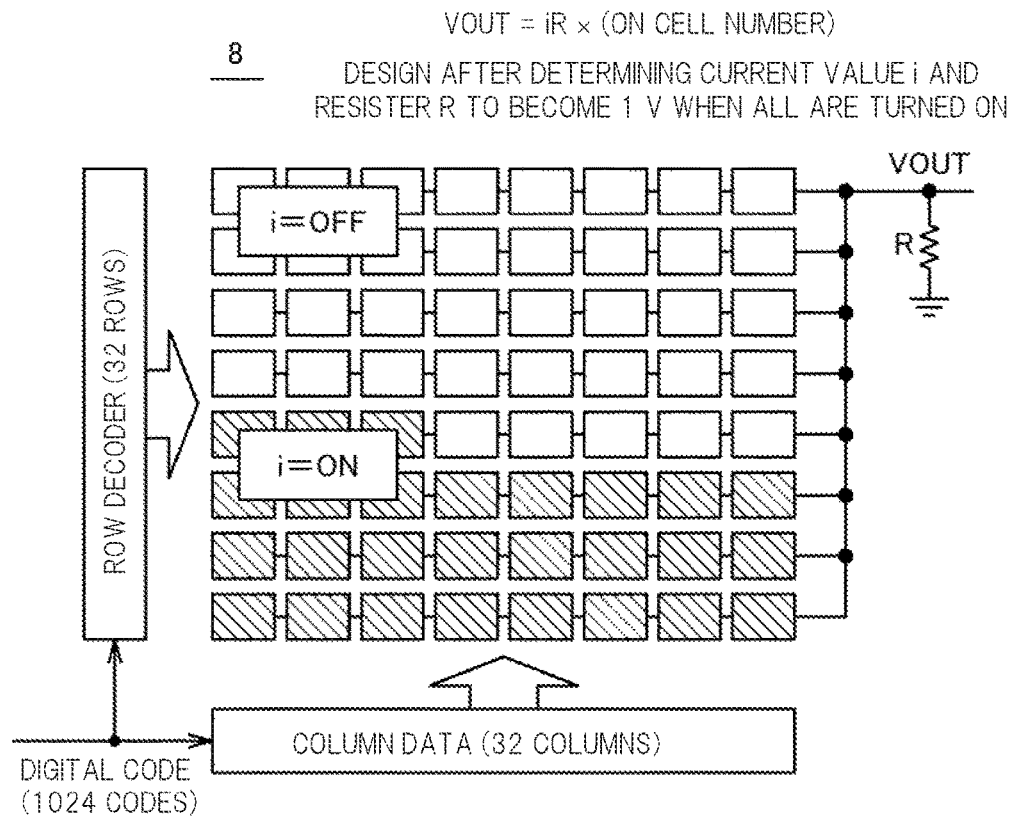
FIG. 4A is a diagram for explaining a configuration of a current DAC 8 according to the embodiment.

With reference to FIG. 4A, a current DAC 8 includes a plurality of current cells arranged in a matrix. Further, the current DAC 8 includes a row decoder and a column decoder, and sets a current cell to be driven (ON) according to an input of the digital code (10 bits). A current value i of the current DAC 8 is set according to the number of current cells to be turned on. In this example, shown is a case where the current value i and the resistance R are set so as to be 1 V when all the current cells are turned on.

Figure 4B:
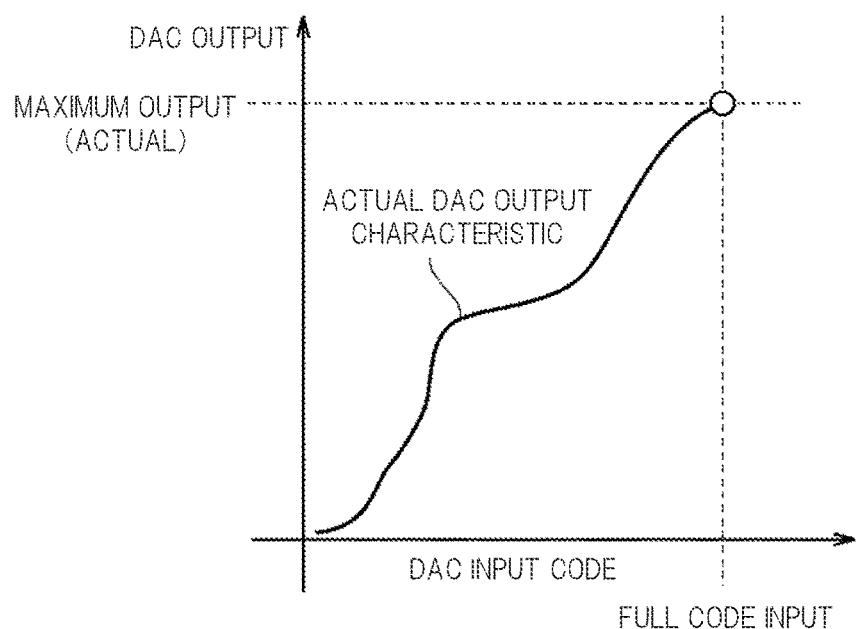
FIG. 4B is a diagram for explaining a configuration of a current DAC 8 according to the embodiment.

FIG. 4B shows characteristics of the current DAC 8 according to the embodiment. As a code value of the input code (10 bits) becomes larger, a DAC output becomes larger. Then, it is basically desirable that the DAC output becomes linear with respect to an increase in the code value, but characteristics of the actual DAC output have a non-linear part. It is important that specification requirements are satisfied even in the non-linear part.

FIG. 5 is a diagram for explaining a DNL test of a DA converter according to the embodiment.

Figure 5C:
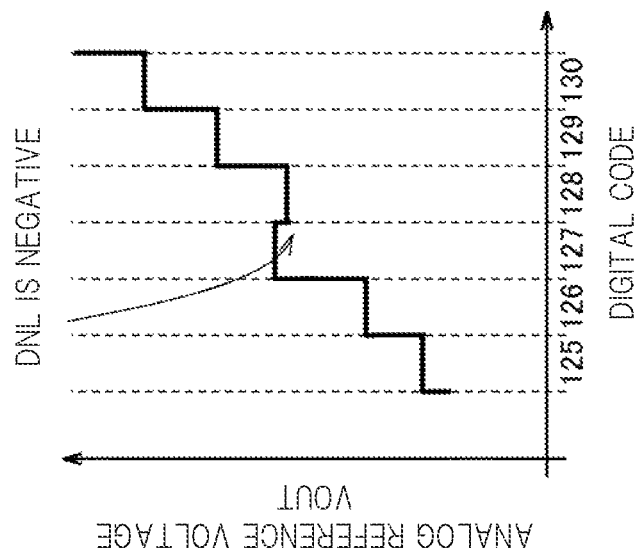
FIG. 5C is a diagram for explaining a DNL test of a DA converter according to the embodiment.
Figure 5B:
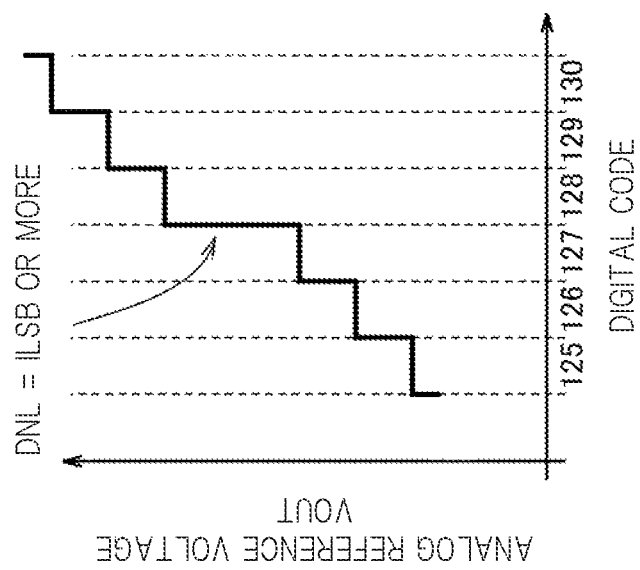
FIG. 5B is a diagram for explaining a DNL test of a DA converter according to the embodiment.
Figure 5A:
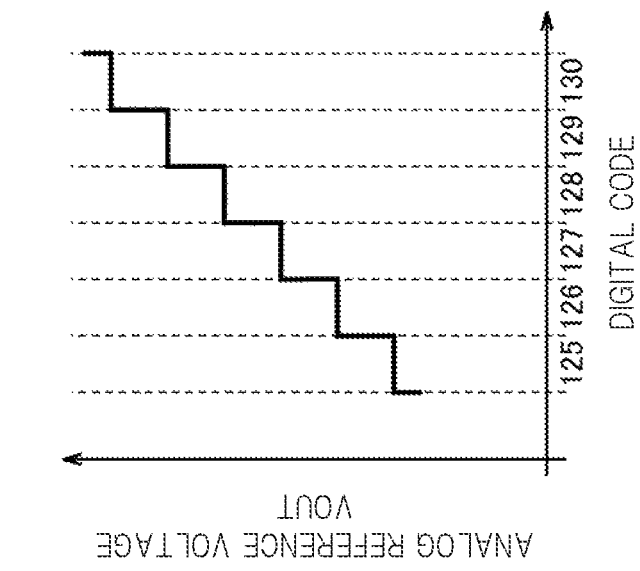
FIG. 5A is a diagram for explaining a DNL test of a DA converter according to the embodiment.

With reference to FIG. 5A, shown is a case where the reference voltage VOUT rises per constant value with respect to an increase in the code value of the digital code. Meanwhile, with reference to FIG. 5B, shown is a case where there is a portion at which the DNL has 1 LSB (LSB: least significant bit) or more. Also, with reference to FIG. 5C, shown is a case where even if the reference voltage VOUT must increase according to the increase in the digital code, the DNL becomes negative.

It is necessary that such a situation is judged as defect since it affects performance of the DA converter.

Figure 6:
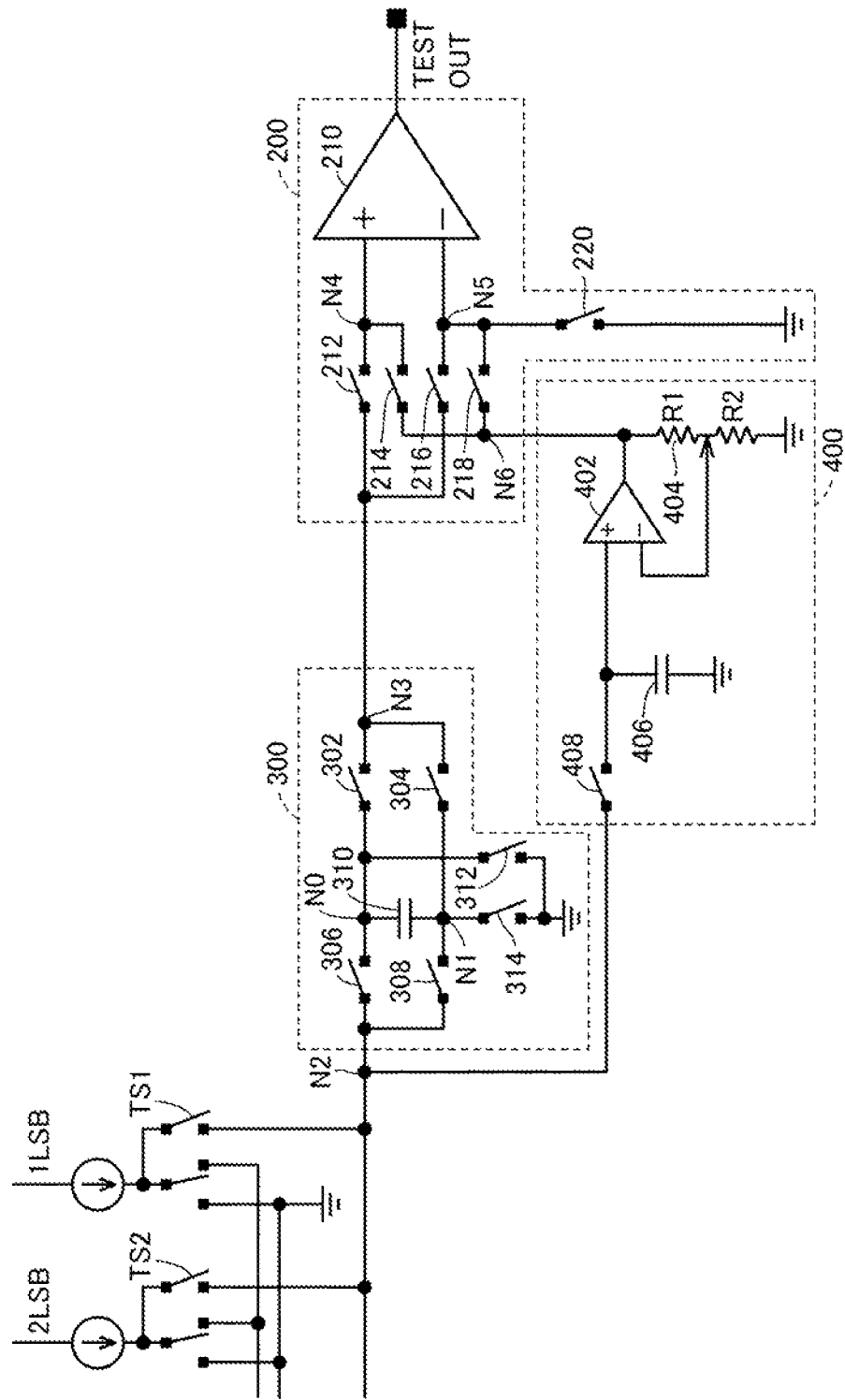
FIG. 6 is a diagram for explaining a configuration of a test circuit 6 according to the embodiment.

FIG. 6 is a diagram for explaining a configuration of the test circuit 6 according to the embodiment.

With reference to FIG. 6, the test circuit 6 includes a comparison circuit 200, a charge information holding circuit 300, and a reference voltage generation circuit 400.

The charge information holding circuit 300 holds, as differential charge information, a difference value between a first charge according to a first current and a second charge according to a second current by at least one or more current cells among the plurality of current cells of the current DAC 8. The reference voltage generation circuit 400 generates a reference voltage to be comparative object.

The comparison circuit 200 compares a determination voltage according to the differential charge information with the reference voltage, and outputs a comparison result.

The charge information holding circuit 300 includes a capacitor 310, and switches 302, 304, 306, 308, 312, 314. Incidentally, the above-mentioned switch may adopt a complementary type switch of PMOS/NMOS. Further, it may provide a dummy switch for charge injection/clock field through countermeasures in operating the switch. Furthermore, it can use an operation clock in operating the switch, and may use a non-overlapping clock in order to avoid simultaneous ON of the switches.

The capacitor 310 is provided between a node N0 and a node N1.

The switch 306 is provided between a node N2 and the node N0. The switch 308 is provided between the node N2 and the node N1. The switch 314 is provided between the node N1 and the fixed voltage VSS. The switch 312 is provided between the node N0 and the fixed voltage VSS. The switch 302 is provided between the node N0 and the node N3. The switch 304 is provided between the node N3 and the node N1.

The reference voltage generation circuit 400 includes a capacitor 406, a non-inverting amplifier 402, and a switch 408. The capacitor 406 is provided between an input node of the non-inverting amplifier 402 and the fixed voltage VSS. The switch 408 is provided between the node N2 and the non-inverting amplifier 402. The non-inverting amplifier 402 includes a variable resistance element 404. By adjusting a resistance value of the variable resistance element 404, an amplification factor of the non-inverting amplifier 402 is adjusted.

The comparison circuit 200 includes a comparator 210, and switches 212, 214, 216, 218, 220.

The switch 212 is provided between an input node N4 of the comparator 210 and the node N3. The switch 214 is provided between the input node N4 of the comparator 210 and a node N6. The switch 216 is provided between an input node N5 of the comparator 210 and the node N3. The switch 218 is provided between the input node N5 of the comparator 210 and the node N6. The switch 220 is provided between the input node N5 of the comparator 210 and the fixed voltage VSS. The node N6 is connected to an output node of the non-inverting amplifier 402.

The current DAC 8 includes a switch that controls connection between the test circuit 6 and the current DAC.

In this example, switches TS1, TS2, . . . are provided. Operating the switches TS1, TS2 makes it possible to supply a current to the test circuit 6.

The control circuit 10 controls the reference voltage generation circuit 5, and executes various test operations by controlling connection of the switch.

Figure 7:
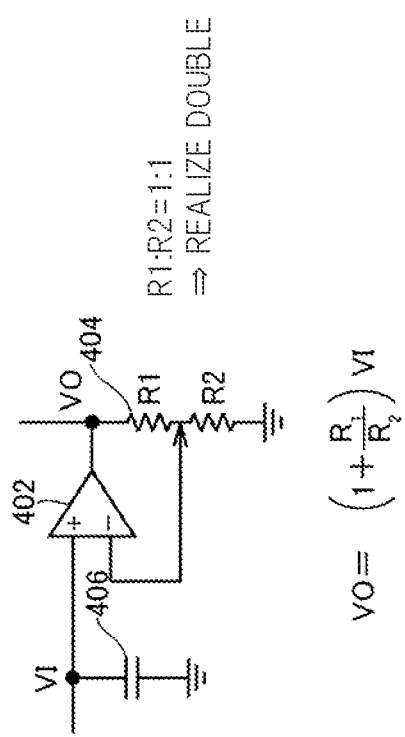
FIG. 7 is a diagram for explaining a configuration of a non-inverting amplifier 402 according to the embodiment.

FIG. 7 is a diagram for explaining a configuration of the non-inverting amplifier 402 according to the embodiment.

With reference to FIG. 7, the non-inverting amplifier 402 outputs an amplified output voltage VO with respect to the input voltage VI. Specifically, the output voltage VO is outputted based on the amplification factor corresponding to a resistance ratio of the variable resistance element 404. As an example, by setting the resistance ratio of the resistors R1 and R2 of the variable resistance element 404 to 1:1, the non-inverting amplifier 402 outputs the output voltage VO that is twice the input voltage VI.

(DNL (Differential Non-Linearity) Test)

A DNL test according to the embodiment will be described below.

Figure 8:
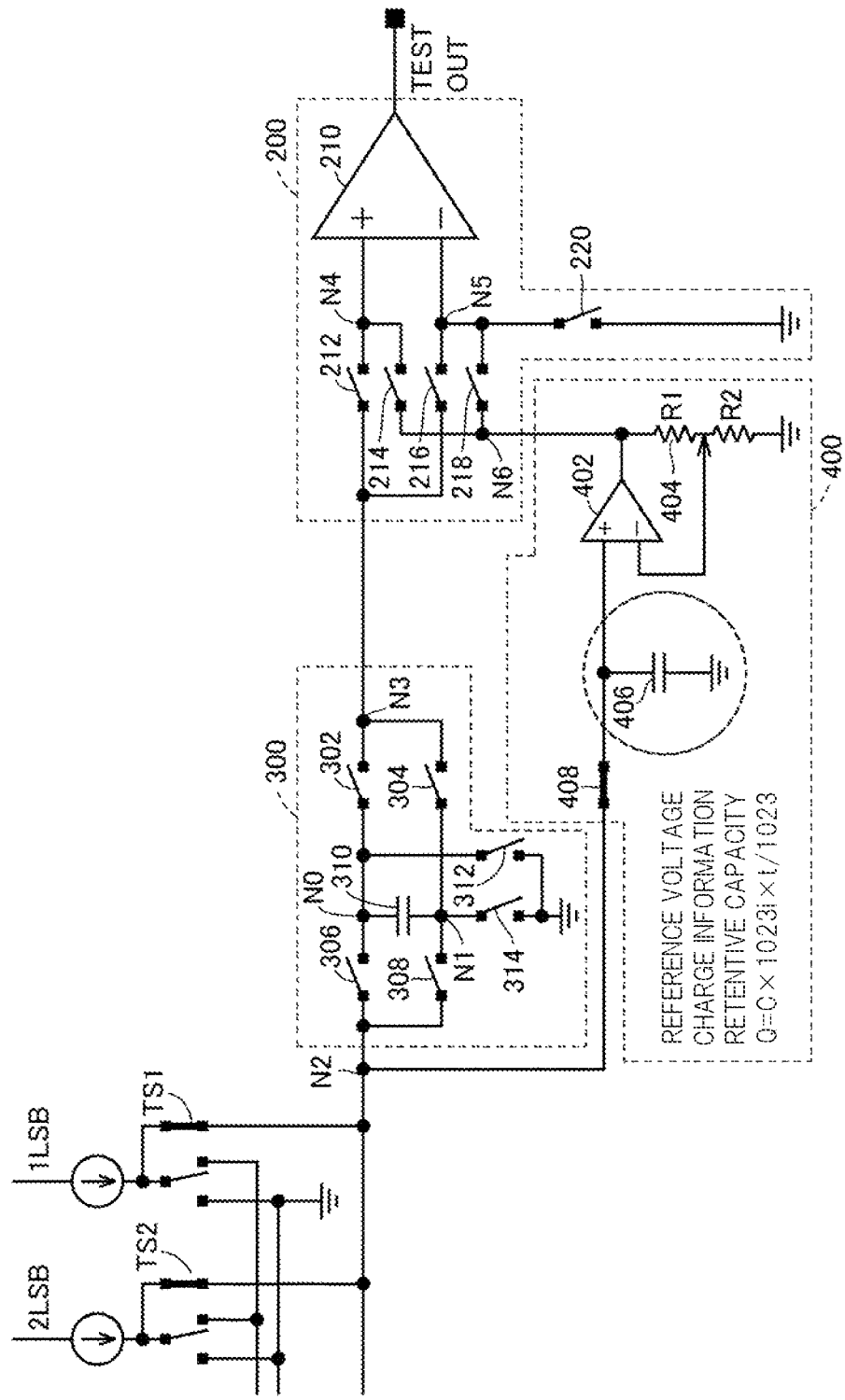
FIG. 8 is a diagram for explaining a case where reference charge information is stored in a reference voltage generation circuit 400 at a DNL test according to the embodiment.

FIG. 8 is a diagram for explaining a case where the reference charge information is stored in the reference voltage generation circuit 400 at a DNL test according to the embodiment. With reference to FIG. 8, after resetting a charge of the capacitor 406, charges of a total current source (1023i) are stored (accumulated) as the reference charge information in the capacitor 406 by using a time t/1023. Incidentally, as one example, a case where the digital code inputted to the current DAC 8 is 10 bits will be described. When the digital code inputted to the current DAC 8 is 12 bits, charges of the entire current source (4095i) may be stored in the capacitor 406 by using a time t/4095.

Specifically, all the switches TS1 and TS2, etc. are turned on to connect all the current cells of the current DAC 8 and the node N2. Further, the switch 408 is turned on to connect the node N2 and the capacitor 406. The other switches are turned off.

At this point, a charge amount is adjusted by adjusting an on-time of the switch.

Specifically, the time for turning on the switch 408 is set to a time t/1023.

Consequently, the charge stored in the capacitor 406 is set to $Q=C\times 1023i\times t/1023$.

Figure 9:
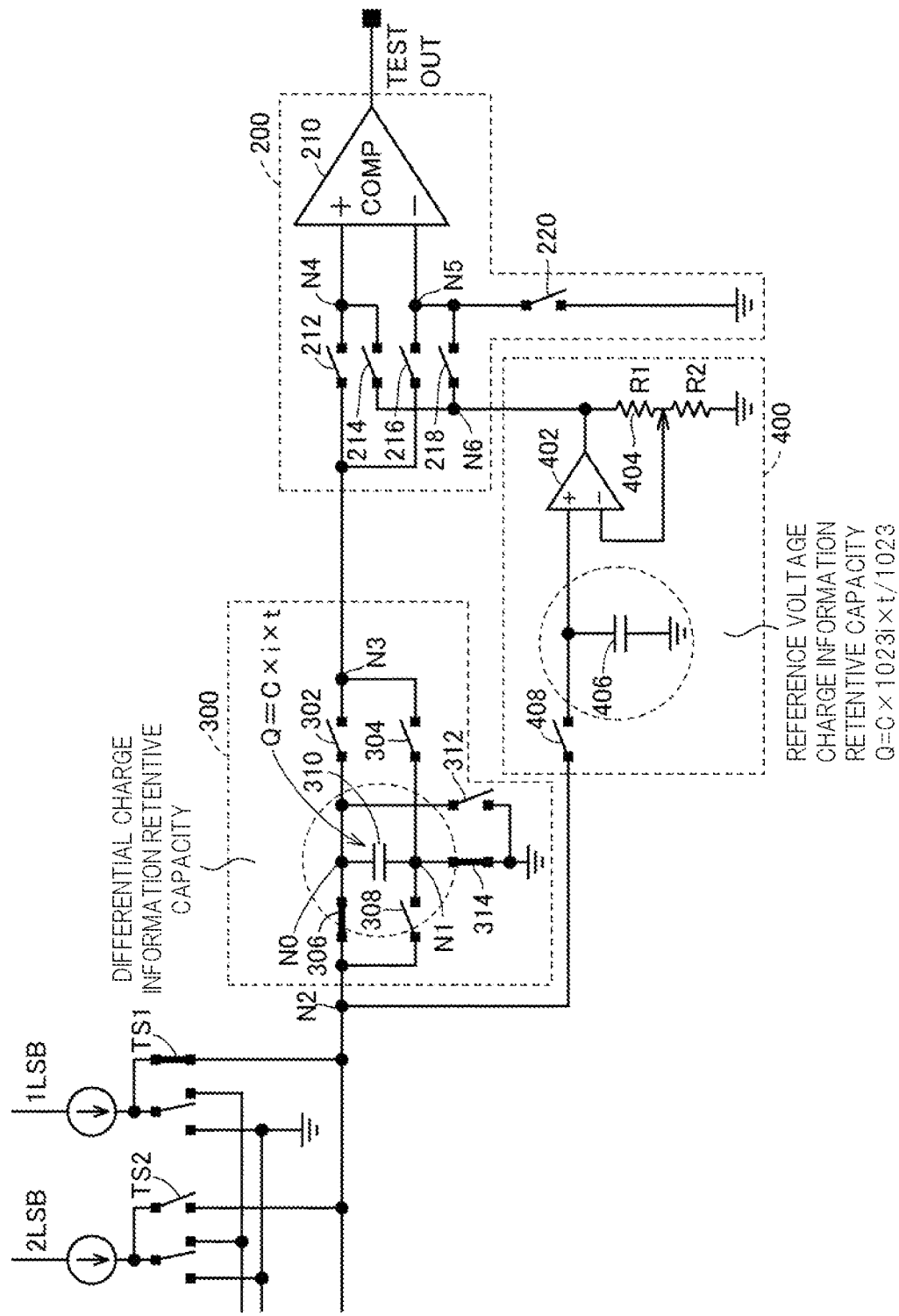
FIG. 9 is a diagram (No. 1) for explaining a case where differential charge information is stored in a charge information holding circuit 300 at the DNL test according to the embodiment.

FIG. 9 is a diagram (No. 1) for explaining a case where the differential charge information is stored in the charge information holding circuit 300 at the DNL test according to the embodiment. With reference to FIG. 9, after resetting a charge of the capacitor 310, a charge of a current source (1i) is stored as charge information in the capacitor 310 by using a time t.

Specifically, the switch TS1 is turned on to connect the 1LSB current cell and the node N2. Further, the switch 306 is turned on to connect the node N2 and a node N0 side of the capacitor 310. Furthermore, the switch 314 is turned on to connect a node N1 side of the capacitor 310 and the fixed voltage VSS. The other switches are turned ff.

Also, a charge amount is adjusted by adjusting an on-time of the switch.

Specifically, each time for turning on the switches 306, 314 is set to the time t.

Consequently, the charge stored in the capacitor 310 is set to $Q=C\times i\times t$.

Figure 10:
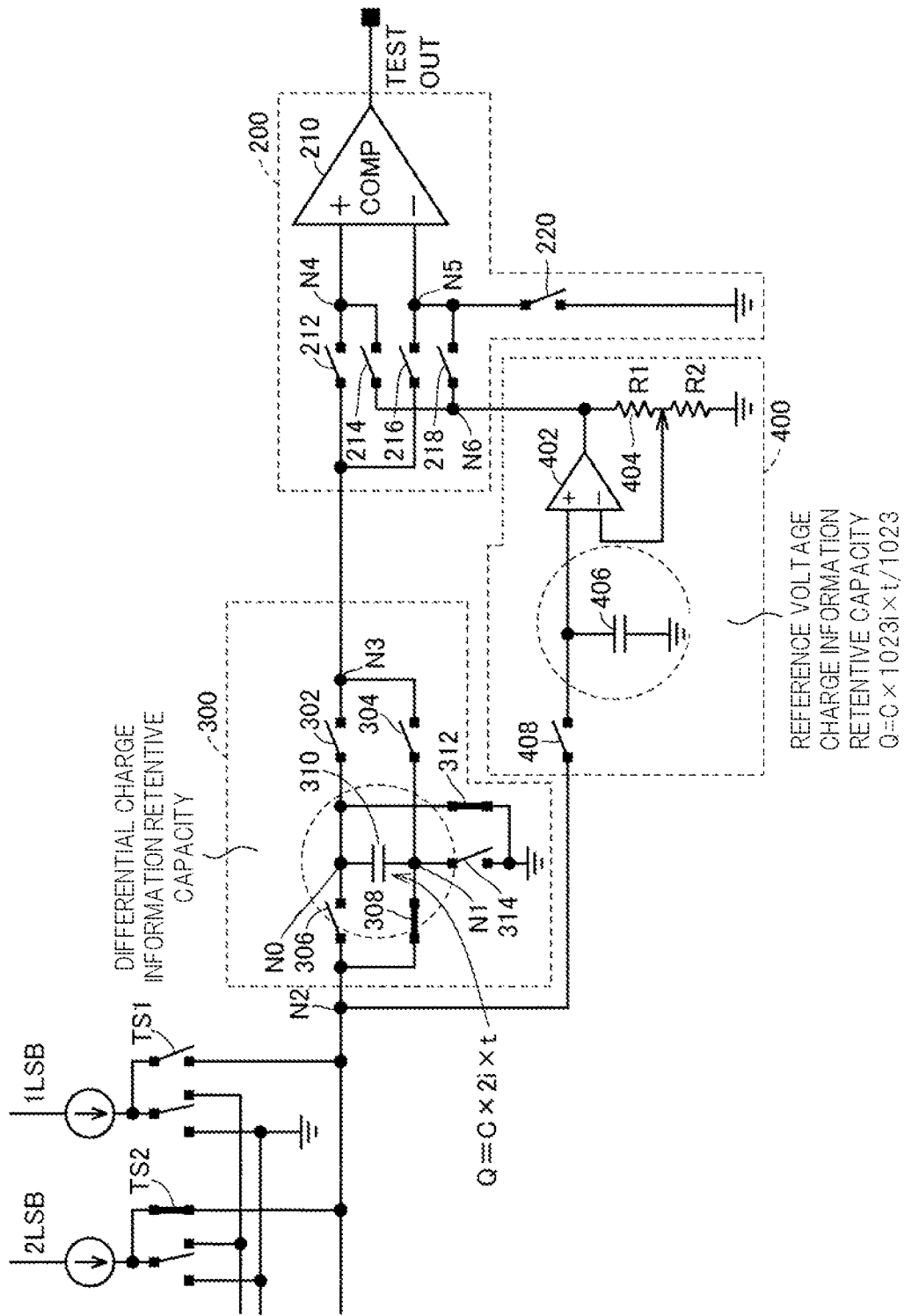
FIG. 10 is a diagram (No. 2) for explaining a case where differential charge information is stored in a charge information holding circuit 300 at the DNL test according to the embodiment.

FIG. 10 is a diagram (No. 2) for explaining a case where the differential charge information is stored in the charge information holding circuit 300 at the DNL test according to the embodiment. With reference to FIG. 10, next, the differential charge information is stored in the capacitor 310.

Specifically, the switch TS2 is turned on to connect a 2LSB current cell and the node N2. Further, the switch 308 is turned on to connect the node N2 and a node N1 side of the capacitor 310. Furthermore, the switch 312 is turned on to connect the node N0 side of the capacitor 310 and the fixed voltage VSS. The other switches are turned off.

Also, the charge amount is adjusted by adjusting the on-time of the switch.

Specifically, each time for turning on the switches 308, 312 is set to the time t.

Consequently, the charge stored in the capacitor 310 from the node N1 side of the capacitor 310 is set to $Q=C\times 2i\times t$.

Therefore, the differential charge information is accumulated as the charge information of the capacitor 310.

Figure 11:
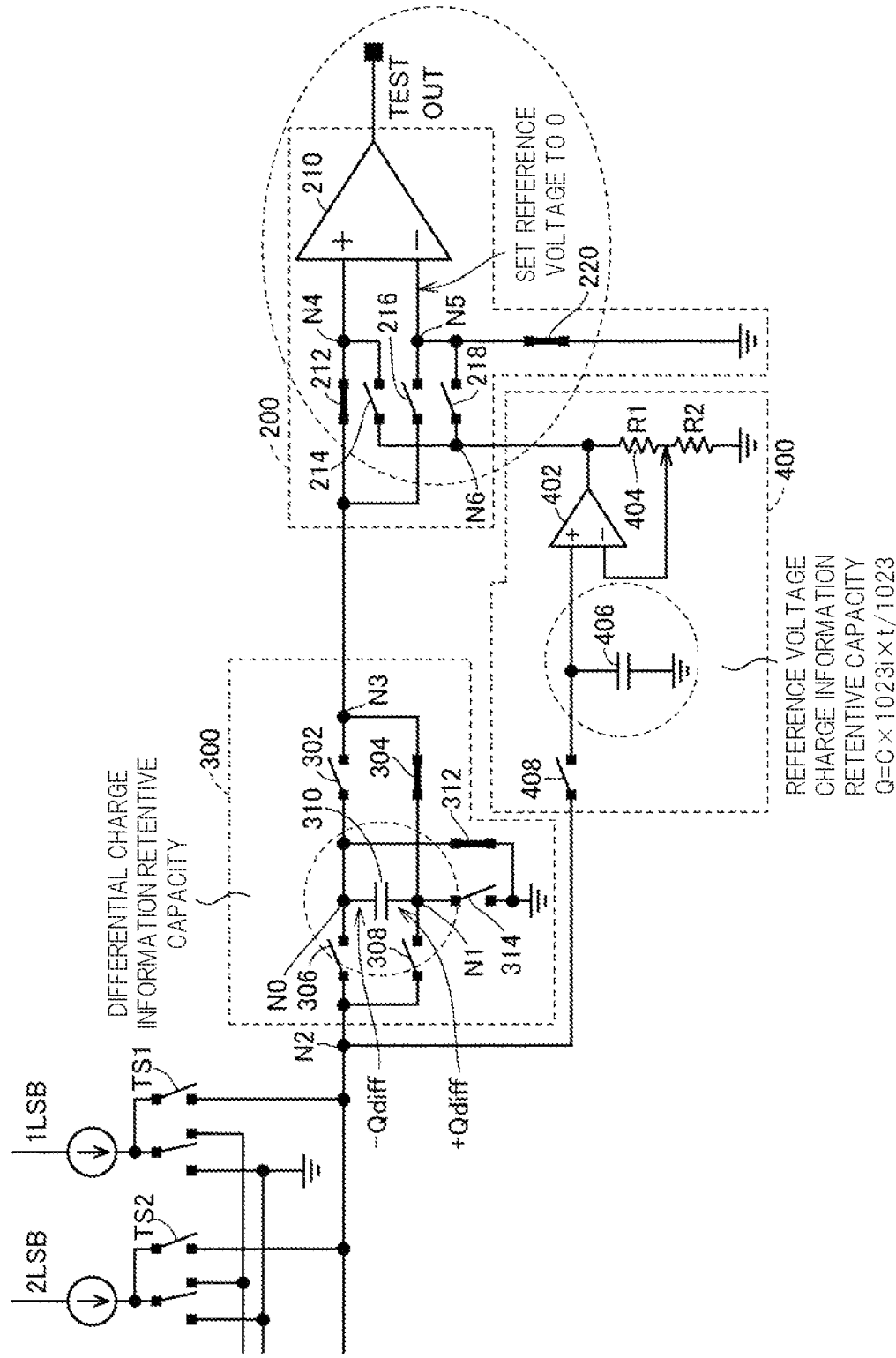
FIG. 11 is a diagram for explaining a DNL spec lower limit test of the differential charge information at the DNL test according to the embodiment.

FIG. 11 is a diagram for explaining a DNL spec lower limit test of differential charge information at the DNL test according to the embodiment. A DNL spec lower limit test will be described with reference to FIG. 11. The node N1 side of the capacitor 310 is set to +Qdiff, and the node N0 side thereof is set to −Qidiff. The switch 304 is turned on to connect node N1 and node N3. The switch 312 is turned on to connect the node N0 and the fixed voltage VSS.

Also, the switch 212 of the comparison circuit 200 is turned on to connect the node N3 and the node N4. Further, the switch 220 of the comparison circuit 200 is turned on to connect the node N5 and the fixed voltage VSS. The other switches are turned off.

Consequently, an input node N4 of the comparator 210 receives an input of a voltage according to the charge stored in the capacitor 310. Further, an input node N5 of the comparator 210 is connected to the fixed voltage VSS.

The comparator 210 outputs an "H" level if a voltage of the input node N4 of the comparator 210 is larger than the fixed voltage VSS (0 V as an example). The comparator 210 outputs an "L" level if the voltage of the input node N4 of the comparator 210 is smaller than the fixed voltage VSS (0 V as an example).

That is, if the differential charge information based on a current difference between the 2LSB and 1LSB current cells is positive, the comparator 210 outputs the "H" level. Meanwhile, if the differential charge information based on the current difference between the 2LSB and 1LSB current cells is negative, the comparator 210 outputs the "L" level. In other words, as a spec lower limit test of the differential charge information, it is determined whether the differential charge information based on the current difference between the 2LSB and 1LSB current cells is positive.

If the comparator 210 is at the "H" level, this is judged OK, and if the comparator 210 is at the "L" level, this is judged as NG.

Figure 12:
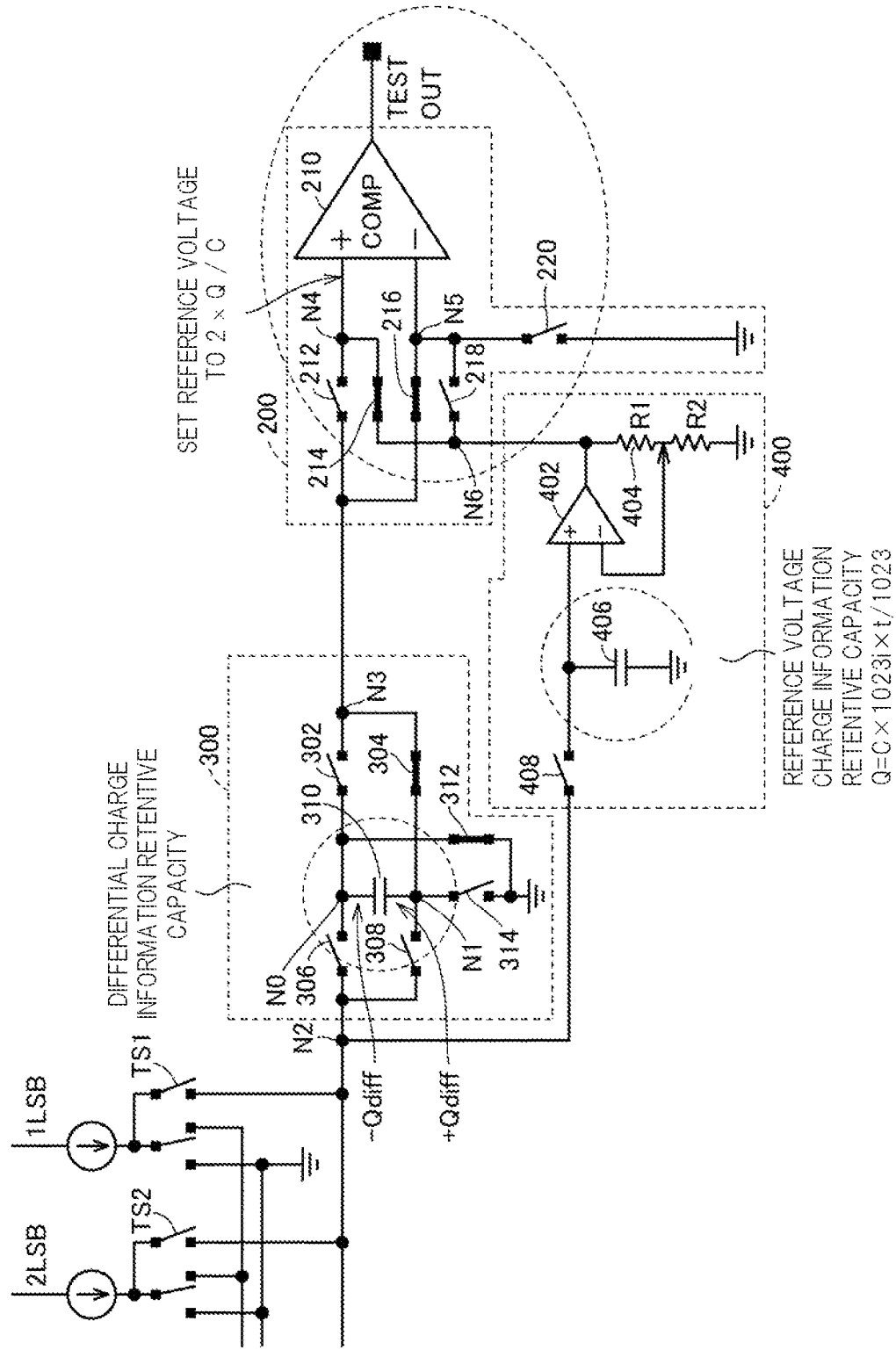
FIG. 12 is another diagram for explaining a DNL spec upper limit test of the differential charge information at the DNL test according to the embodiment.

FIG. 12 is another diagram for explaining a DNL spec upper limit test of the differential charge information at the DNL test according to the embodiment. The DNL spec upper limit test will be described with reference to FIG. 12. A node N1 side of the capacitor 310 is set to +Qdiff, and a node N0 side thereof is set to −Qidiff. The switch 304 is turned on to connect the node N1 and the node N3. The switch 312 is turned on to connect the node N0 and the fixed voltage VSS.

Also, the switch 216 of the comparison circuit 200 is turned on to connect the node N3 and the node N5. Further, the switch 214 of the comparison circuit 200 is turned on to connect the node N4 and the output node of the non-inverting amplifier 402. The other switches are turned off.

Consequently, the input node N5 of the comparator 210 receives an input of a voltage according to the charge stored in the capacitor 310. Further, the input node N4 of the comparator 210 is connected to the output node of the non-inverting amplifier 402.

The comparator 210 outputs an "H" level if a voltage of the input node N4 of the comparator 210 is larger than a voltage of the input node N5. The comparator 210 outputs an "L" level if the voltage of the input node N4 of the comparator 210 is smaller than that of the input node N5. In this example, the voltage of the input node N4 of the comparator 210 is set to 2×Q/C.

That is, the comparator 210 compares the voltage of 2×Q/C with the voltage according to the differential charge information based on the current difference between the 2LSB and 1LSB current cells, and outputs the "H" level if the voltage of 2×Q/C is larger. Meanwhile, if the voltage according to the differential charge information based on the current difference between the 2LSB and 1LSB current cells is larger, the comparator 210 outputs the "L" level. In other words, as a spec upper limit test of the differential charge information, it is determined whether the differential charge information based on the current difference between the 2LSB and 1LSB current cells exceeds 2DNL.

If the comparator 210 is at the "H" level, this is judged as OK, and if the comparator 210 is at the "L" level, this is judged as NG.

The DNL test explained above is shifted by one code, and is conducted in order.

Specifically, according to the procedure described above, the node N0 side of the capacitor 310 and the 2LSB current cell are connected to store a charge according to the 2LSB current cell. Next, the node N1 side of the capacitor 310 and the 3LSB current cell are connected to store a charge according to the 3LSB current cell. Consequently, accumulated in the capacitor 310 is the differential charge information of the 3LSB and 2LSB. Then, for the differential charge information, the spec lower limit test and the spec upper limit test are conducted as described with reference to FIGS. 11 and 12.

Executing this with all the codes makes it possible to detect the defect of the DA converter at the DNL test described in FIG. 5.

The differential charge information is accumulated in the capacitor 310 by a test method according to the embodiment. The capacitor 310 is connected to the internal fixed voltage VSS. Even if there is a fluctuation (noise component) in the fixed voltage, the highly accurate differential charge information excluding the noise component can be accumulated in order that the noise component is canceled in the differential charge information. Further, since the same capacitor 310 is used for comparison, an influence of manufacturing variations of the capacitor can be also suppressed. Furthermore, the reference voltage used in the test circuit 6 does not need to be inputted from outside and can be generated internally. Therefore, the reference voltage can be generated in a simple manner without needing to use an external power supply. Furthermore, limiting a range compared and determined by the comparator 210 makes it possible to reduce an error of the comparator 210.

(INL (Integral Non-Linearity) Test)

An INL test according to the embodiment will be described below.

Figure 13:
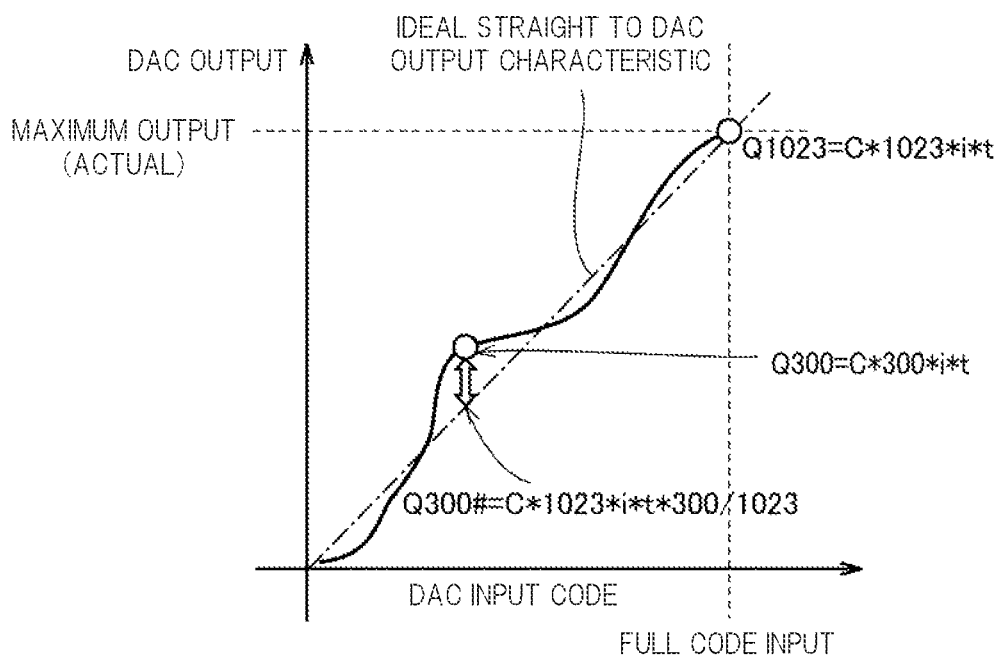
FIG. 13 is a diagram for explaining an INL test of the DA converter according to the embodiment.

FIG. 13 is a diagram for explaining an INL test of a DA converter according to an embodiment.

With reference to FIG. 13, an ideal straight line according to a DAC output characteristic is shown. Also, an actual DAC output is shown.

INL shows deviations of an actual output characteristic with respect to the ideal straight line in the entire relationship between an analog input voltage of the DA converter and a digital output signal.

As an example, shown is a case where a charge amount Q300 in a code 300 and a charge amount Q300 # with respect to the ideal straight line are compared. If a degree of deviations is large in the comparison, performance of the DA converter is affected, so that this needs to be judged as defect.

Figure 14:
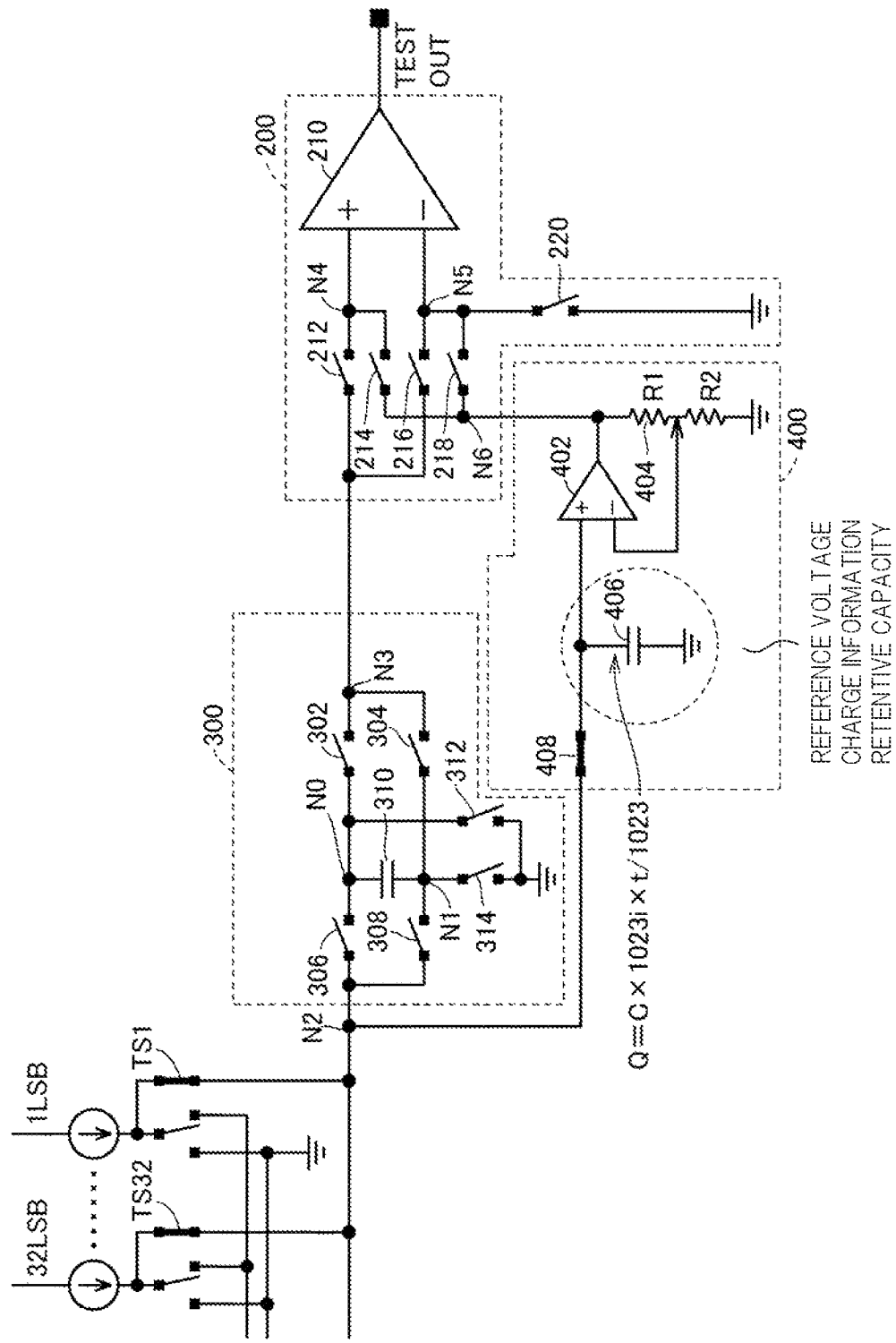
FIG. 14 is a diagram for explaining a case where the reference charge information is stored in the reference voltage generation circuit 400 at the INL test according to the embodiment.

FIG. 14 is a diagram for explaining a case where the reference charge information is stored in the reference voltage generation circuit 400 at the INL test according to the embodiment. With reference to FIG. 14, after resetting a charge of the capacitor 406, charges of the total current source (1023i) are stored in the capacitor 406 by using a time t/1023.

Specifically, all the switches TS1 and TS32, etc. are turned on to connect all the current cells of the current DAC 8 and the node N2. Further, the switch 408 is turned on to connect the node N2 and the capacitor 406. The other switches are turned off.

At this point, the charge amount is adjusted by adjusting the on-time of the switch.

Specifically, the time for turning on the switch 408 is set to the time t/1023.

Consequently, the charge stored in the capacitor 406 is set to Q=C×1023i×t/1023.

Figure 15:
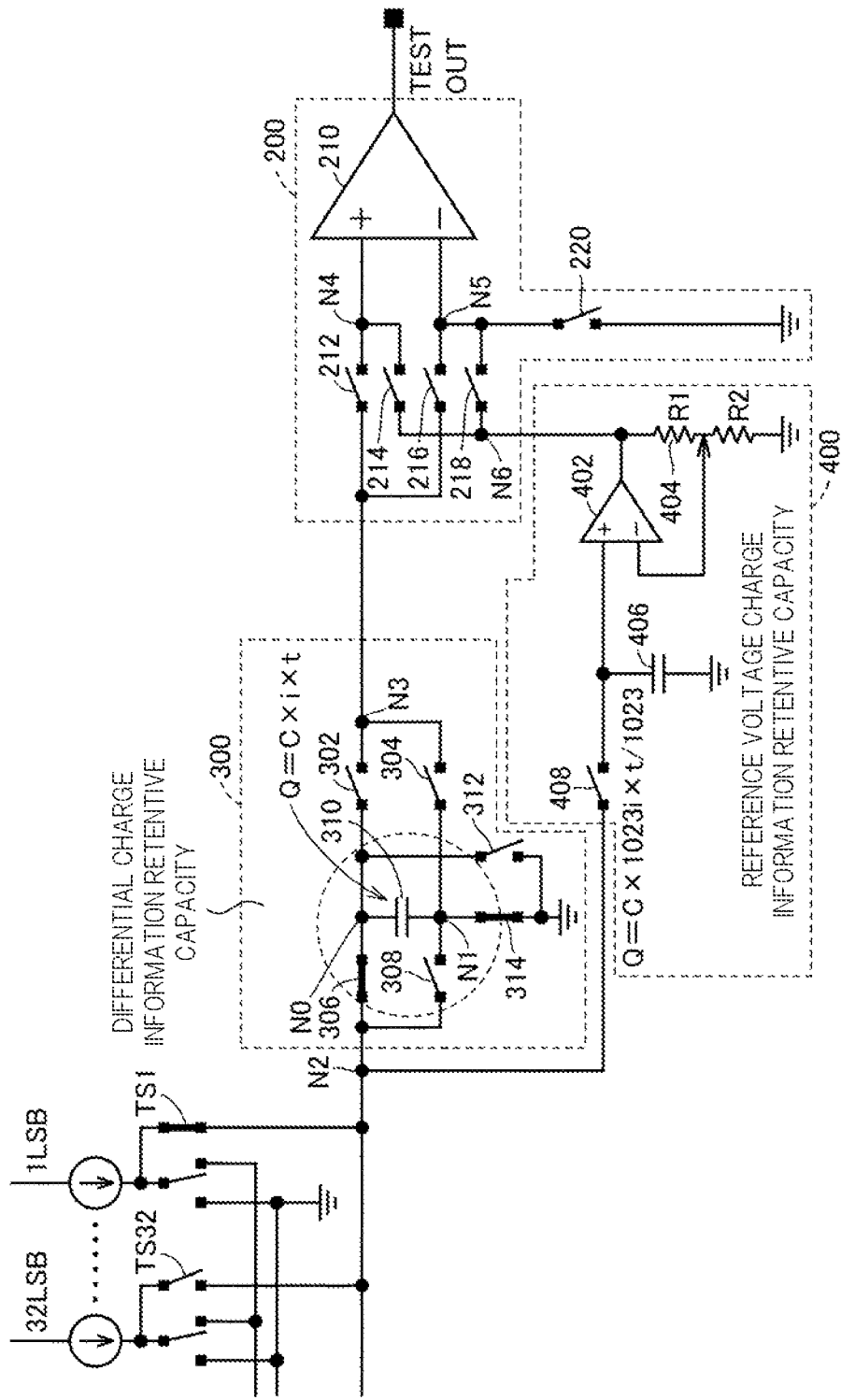
FIG. 15 is a diagram (No. 1) for explaining a case where the differential charge information is stored in the charge information holding circuit 300 at the INL test according to the embodiment.

FIG. 15 is a diagram (No. 1) for explaining a case where the differential charge information is stored in the charge information holding circuit 300 at the INL test according to the embodiment. With reference to FIG. 15, after resetting the charge of the capacitor 310, the charge of the current source (1i) is stored as the charge information in the capacitor 310 by using the time t.

Specifically, the switch TS1 is turned on to connect the node N2 with the 1LSB current cell. Further, the switch 306 is turned on to connect the node N2 and a node NO side of the capacitor 310. Furthermore, the switch 314 is turned on to connect a node N1 side of the capacitor 310 and the fixed voltage VSS. The other switches are turned off.

In addition, the charge amount is adjusted by adjusting the on-time of the switch.

Specifically, each time for turning on the switches 306, 314 is set to the time t.

Consequently, the charge stored in the capacitor 310 is set to $Q=C \times i \times t$.

Figure 16:
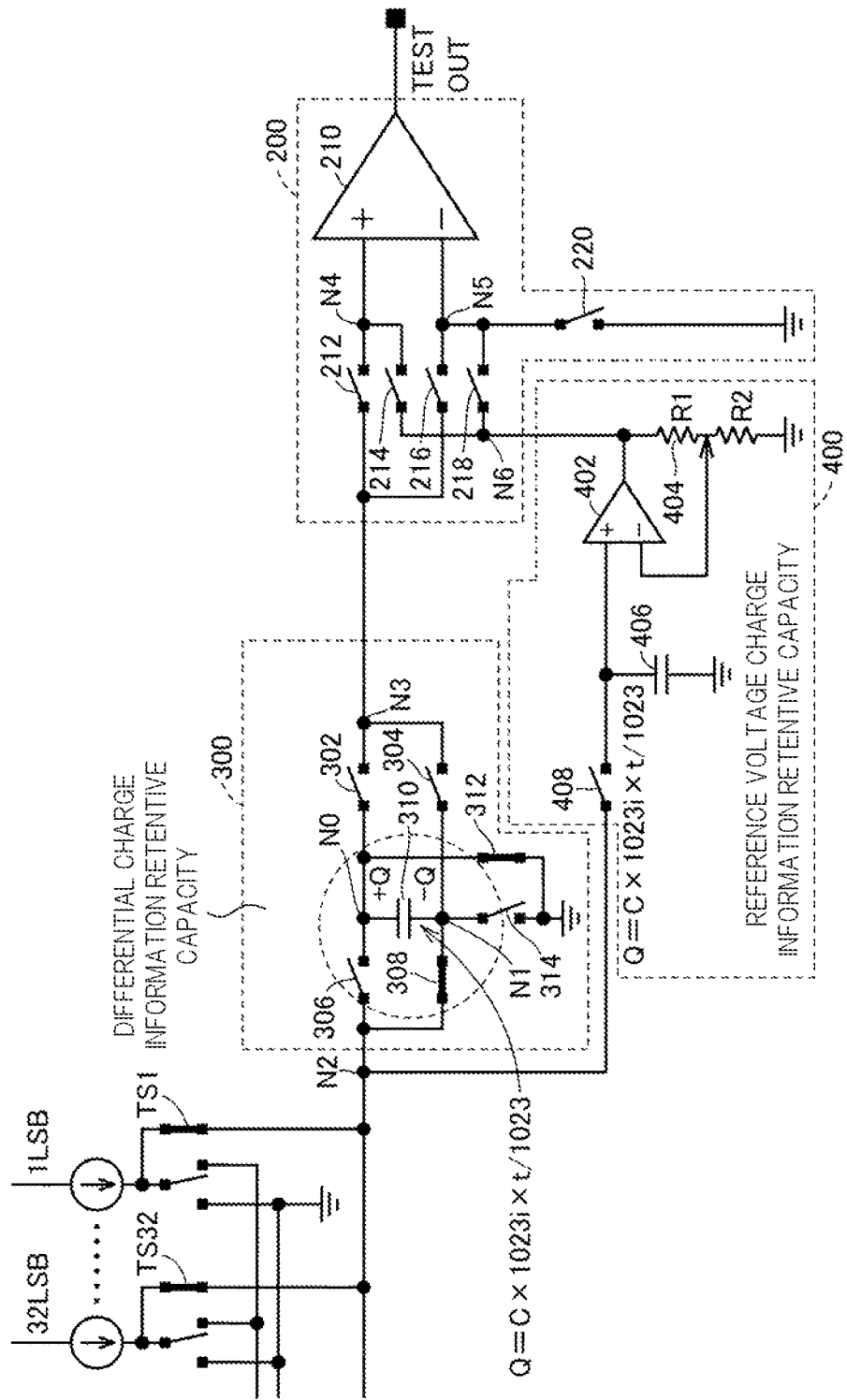
FIG. 16 is a diagram (No. 2) for explaining a case where the differential charge information is stored in the charge information holding circuit 300 at the INL test according to the embodiment.

FIG. 16 is a diagram (No. 2) for explaining a case where the differential charge information is stored in the charge information holding circuit 300 at the INL test according to the embodiment. With reference to FIG. 16, next, the differential charge information is stored in the capacitor 310.

Specifically, all the switches TS1 and TS32, etc. are turned on to connect all the current cells of the current DAC 8 and the node N2. Further, the switch 308 is turned on to connect the node N2 and the node N1 side of the capacitor 310. Furthermore, the switch 312 is turned on to connect the node NO side of the capacitor 310 and the fixed voltage VSS. The other switches are turned off.

Also, the charge amount is adjusted by adjusting the on-time of the switch.

Specifically, each time for turning on the switches 308, 312 is set to the time t/1023.

Consequently, the charge accumulated in the capacitor 310 from the node N1 side of the capacitor 310 is set to $Q=C \times 1023 i \times t/1023$.

Therefore, the differential charge information is accumulated as the charge information of the capacitor 310.

That is, after accumulating the charge of the 1LSB current cell in the capacitor 310, a difference of a charge corresponding to 1LSB based on the ideal straight line with respect to the DAC output characteristic is accumulated.

Figure 17:
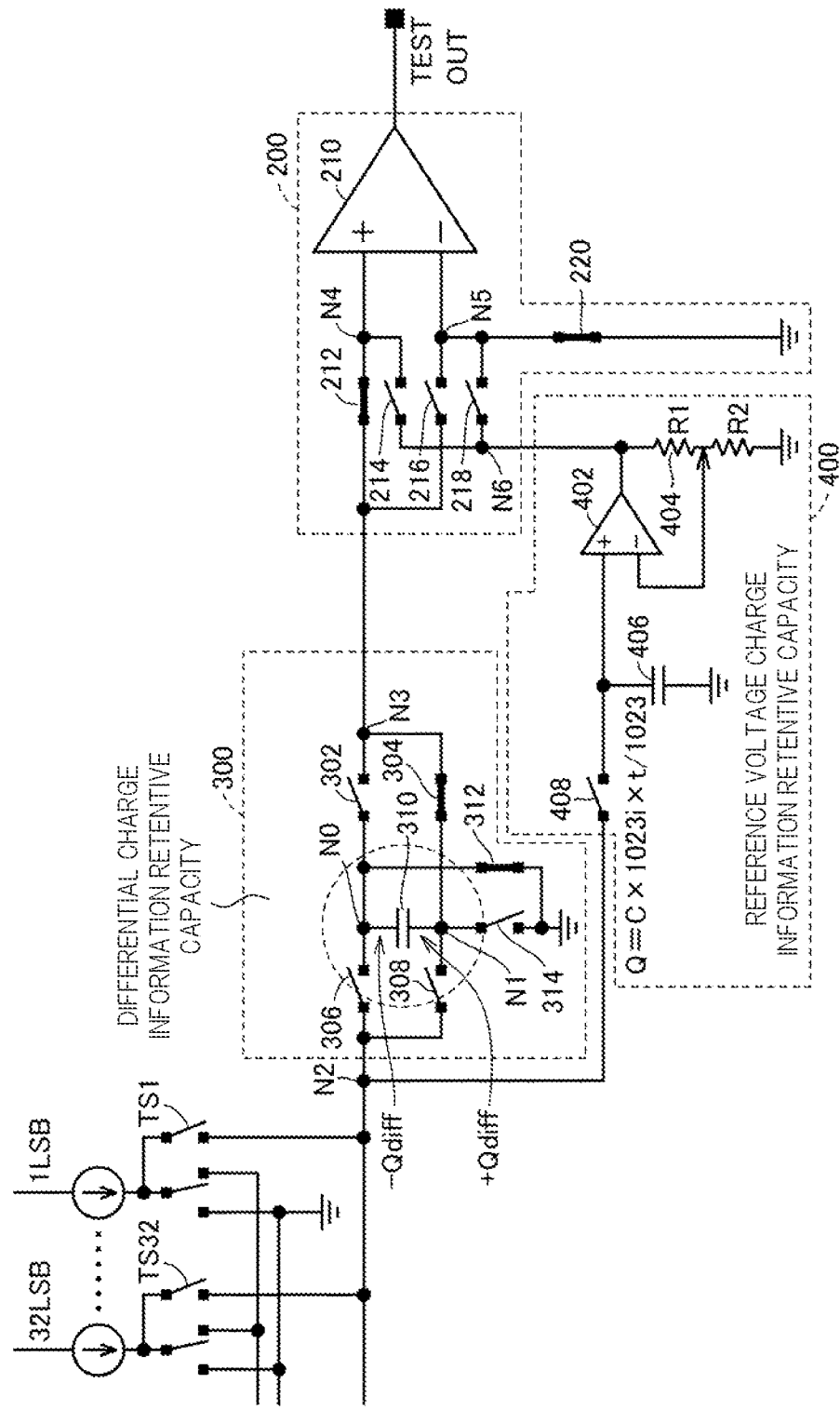
FIG. 17 is a diagram for explaining determination of a polarity of the differential charge information at the INL test according to the embodiment.

FIG. 17 is a diagram for explaining determination of a polarity of the differential charge information at the INL test according to the embodiment. With reference to FIG. 17, as the differential charge information, the node N1 side of the capacitor 310 is set to +Qdiff, and the node NO side is set to −Qdiff. The switch 304 is turned on to connect the node N1 and the node N3. The switch 312 is turned on to connect the node NO and the fixed voltage VSS.

Also, the switch 212 of the comparison circuit 200 is turned on to connect the node N3 and the node N4. Further, the switch 220 of the comparison circuit 200 is turned on to connect the node N5 and the fixed voltage VSS. The other switches are turned off.

Consequently, the input node N4 of the comparator 210 receives an input of a voltage according to the charge stored in the capacitor 310. Further, the input node N5 of the comparator 210 is connected to the fixed voltage VSS.

The comparator 210 outputs an "H" level if a voltage of the input node N4 of the comparator 210 is larger than the fixed voltage VSS (0 V as an example). The comparator 210 outputs an "L" level if the voltage of the input node N4 of the comparator 210 is smaller than the fixed voltage VSS (0 V as an example).

That is, the output of the comparator 210 makes it possible to determine a polarity of the capacitor 310. When the output of the comparator 210 is at the "H" level, this indicates that the charge corresponding to 1LSB based on the ideal straight line is accumulated more than the charge of the 1LSB current cell. In other words, shown is a case where the charge amount of the 1LSB current cell is lower than the charge amount corresponding to 1LSB based on the ideal straight line. In this case, the spec lower limit test of the charge of the 1LSB current cell is conducted.

Meanwhile, when the output of the comparator 210 is at the "L" level, this indicates that the charge corresponding to 1LSB based on the ideal straight line is accumulated less than the charge of the 1LSB current cell. In other words, shown is a case where the charge amount of the 1LSB current cell is larger than the charge corresponding to 1LSB based on the ideal straight line. In this case, the spec upper limit test of the charge of the 1LSB current cell is conducted.

Figure 18:
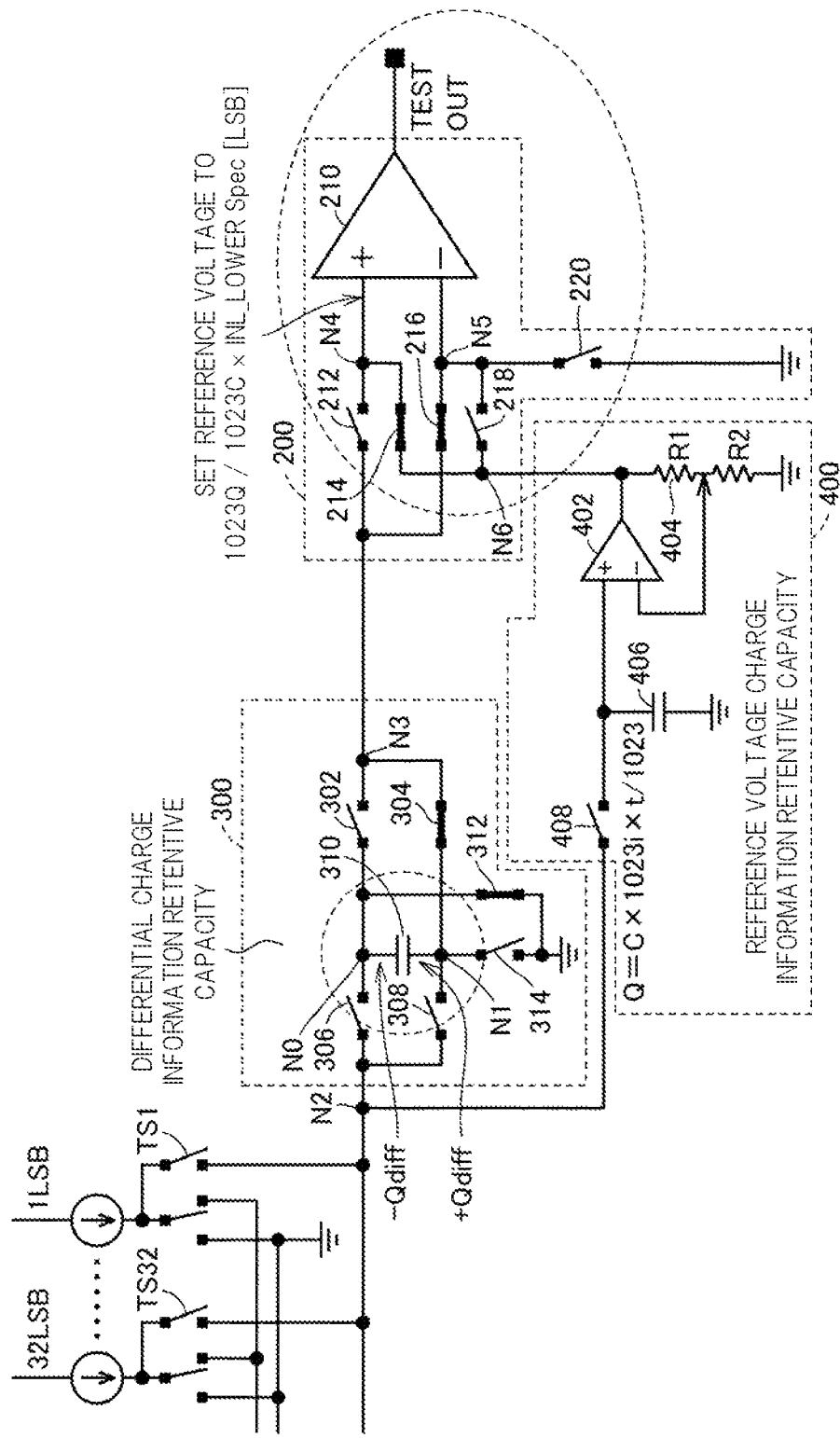
FIG. 18 is a diagram for explaining an INL spec lower limit test of the differential charge information according to the embodiment.

FIG. 18 is a diagram for explaining an INL spec lower limit test of differential charge information according to the embodiment. The INL spec lower limit test will be described with reference to FIG. 18. The node N1 side of the capacitor 310 is set to +Qdiff, and the node NO side is set to −Qidiff. The switch 304 is turned on to connect the node N1 and the node N3. The switch 312 is turned on to connect the node NO and the fixed voltage VSS.

Further, the switch 216 of the comparison circuit 200 is turned on to connect the node N3 and the node N5. Furthermore, the switch 214 of the comparison circuit 200 is turned on to connect the node N4 and the node N6. The other switches are turned off.

Consequently, the input node N5 of the comparator 210 receives the input of the voltage according to the charge stored in the capacitor 310. Further, the input node N4 of the comparator 210 is connected to the output node of the non-inverting amplifier 402.

The comparator 210 outputs an "H" level if the voltage of the input node N4 of the comparator 210 is larger than that of the input node N5. The comparator 210 outputs an "L" level if the voltage of the input node N4 of the comparator 210 is smaller than that of the input node N5.

That is, when the charge amount of the 1LSB current cell is lower than the charge corresponding to 1LSB based on the ideal straight line, magnitude of the differential charge information is determined.

For example, an INL spec lower limit is set as 3LSB. The reference voltage is set by adjusting a resistance value of the variable resistance element 404. Specifically, the adjustment is set to comply with the resistors R1:R2=2:1. With this setting, the output voltage VO outputs a voltage that is three times the input voltage VI. The resistance ratio can be set to any value. Incidentally, by being set to the resistance R2>>R1, the output voltage VO may output a voltage that is once the input voltage VI.

The comparator 210 outputs an "H" level if the magnitude of the differential charge information is less than 3LSB. Meanwhile, if the magnitude of the differential charge information is 3LSB or more, the comparator 210 outputs an "L" level. In other words, as a spec lower limit test of the differential charge information, it is determined whether a degree of deviations is within 3LSB.

If the comparator 210 is at the "H" level, this is judged as OK, and if it is at the "L" level, this is judged as NG.

Figure 19:
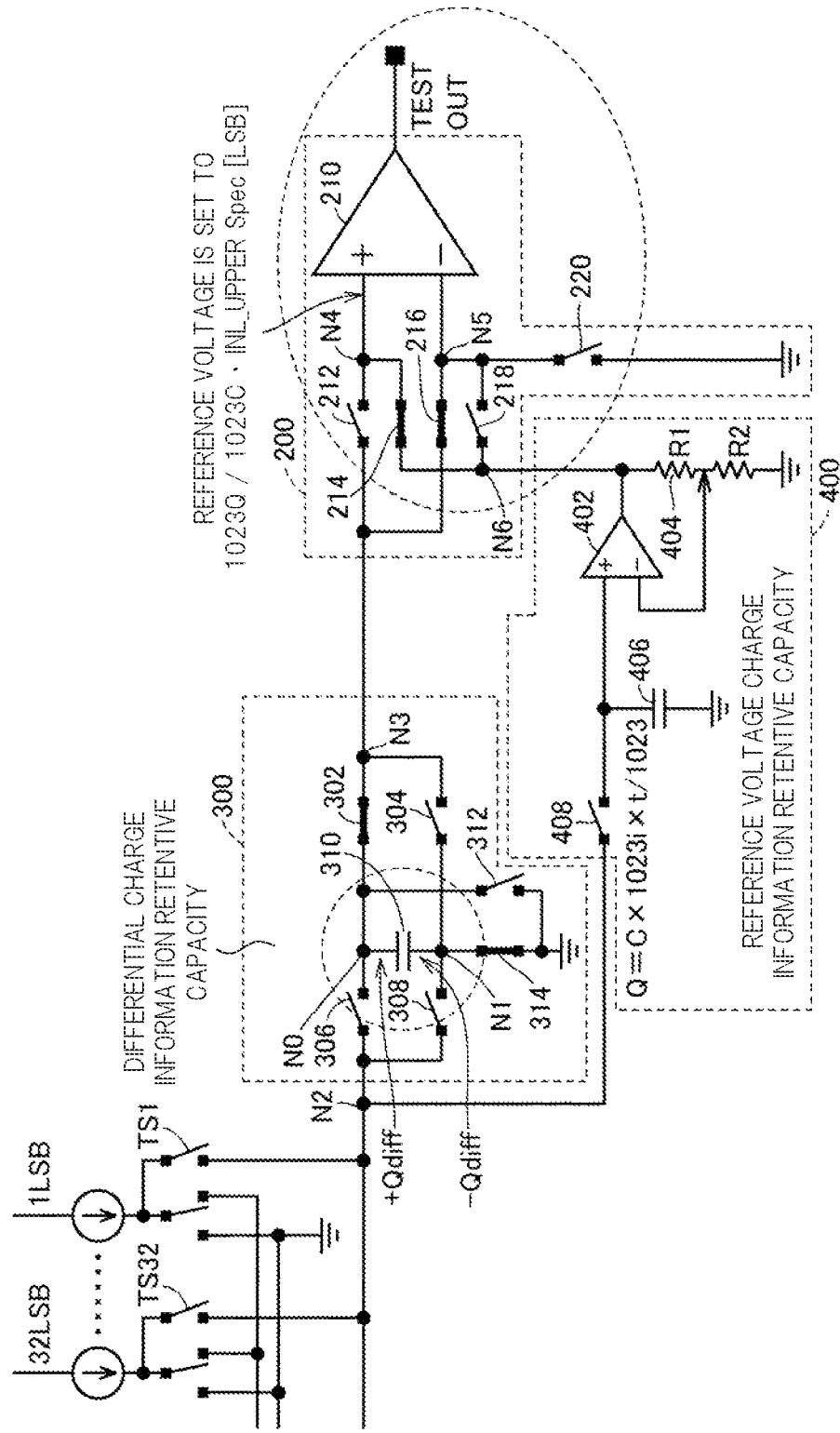
FIG. 19 is a diagram for explaining an INL spec upper limit test of the differential charge information according to the embodiment.

FIG. 19 is a diagram for explaining an INL spec upper limit test of differential charge information according to the embodiment. The INL spec upper limit test will be described with reference to FIG. 19. The node NO side of the capacitor 310 is set to +Qdiff, and the node N1 side is set to −Qidiff. The switch 302 is turned on to connect the node NO and the node N3. The switch 314 is turned on to connect the node N1 and the fixed voltage VSS.

Also, the switch 216 of the comparison circuit 200 is turned on to connect the node N3 and the node N5. Further, the switch 214 of the comparison circuit 200 is turned on to connect the node N4 and the node N6. The other switches are turned off.

Consequently, the input node N5 of the comparator 210 receives an input of a voltage according to the charge stored in the capacitor 310. Further, the input node N4 of the comparator 210 is connected to the output node of the non-inverting amplifier 402.

The comparator 210 outputs an "H" level if the voltage of the input node N4 of the comparator 210 is larger than that of the input node N5. The comparator 210 outputs an "L" level if the voltage of the input node N4 of the comparator 210 is smaller than that of the input node N5.

That is, when the charge amount of the 1LSB current cell is larger than the charge corresponding to 1LSB based on the ideal straight line, the magnitude of the differential charge information is determined.

For example, as an INL spec upper limit, it is set to 3LSB. The reference voltage is set by adjusting a resistance value of the variable resistance element 404. Specifically, the adjustment is set to comply with the resistors R1:R2=2:1. With this setting, the output voltage VO outputs a voltage that is three times the input voltage VI. The resistance ratio can be set to any value. Incidentally, by being set to the resistance R2>>R1, the output voltage VO may output a voltage that is once the input voltage VI.

The comparator 210 outputs an "H" level if the magnitude of the differential charge information is less than 3LSB. Meanwhile, if the magnitude of the differential charge information is 3LSB or more, the comparator 210 outputs a "L" level. In other words, as a spec upper limit test of the differential charge information, it is determined whether the degree of deviations is within 3LSB.

If the comparator 210 is at the "H" level, this is judged as OK, and if the comparator 210 is at the "L" level, this is judged as NG.

The INL test explained above is shifted by one code, and is conducted in order.

Specifically, according to the procedure described above, the node N0 side of the capacitor 310 and the 2LSB current cell are connected to store a charge according to the 2LSB current cell. Next, the node N1 side of the capacitor 310 and the entire current cells are connected, and the charge is accumulated in the capacitor 310 by using the time 2t/1023.

Consequently, after accumulating the charge of the 2LSB current cell in the capacitor 310, a difference in charge corresponding to 2LSB based on the ideal straight line with respect to the DAC output characteristic is accumulated. Then, for the differential charge information, the INL spec lower limit test and the INL spec upper limit test are conducted based on the polarity of the differential charge information as described with reference to FIGS. 17 to 19.

By executing this with all the codes, it becomes possible to detect the defect of the DA converter in the INL test described with reference to FIG. 13.

The differential charge information is accumulated in the capacitor 310 by the test method according to the embodiment. The capacitor 310 is connected to the internal fixed voltage VSS. Even if there is the fluctuation in the fixed voltage (noise component), the highly accurate differential charge information excluding the noise component can be accumulated in order that the noise component is canceled in the differential charge information. Further, since the same capacitor 310 is used for comparison, the influence of the manufacturing variations of the capacitor can also be suppressed. Furthermore, the reference voltage used in the test circuit 6 can be generated internally without needing to be inputted from outside. Therefore, the reference voltage can be generated in the simple manner without needing to use an external power supply. Further, limiting the range of comparison and determination by the comparator 210 makes it possible to reduce the error of the comparator 210.

(Gain Error Test)

A gain error test according to the embodiment will be described below.

Figure 20:
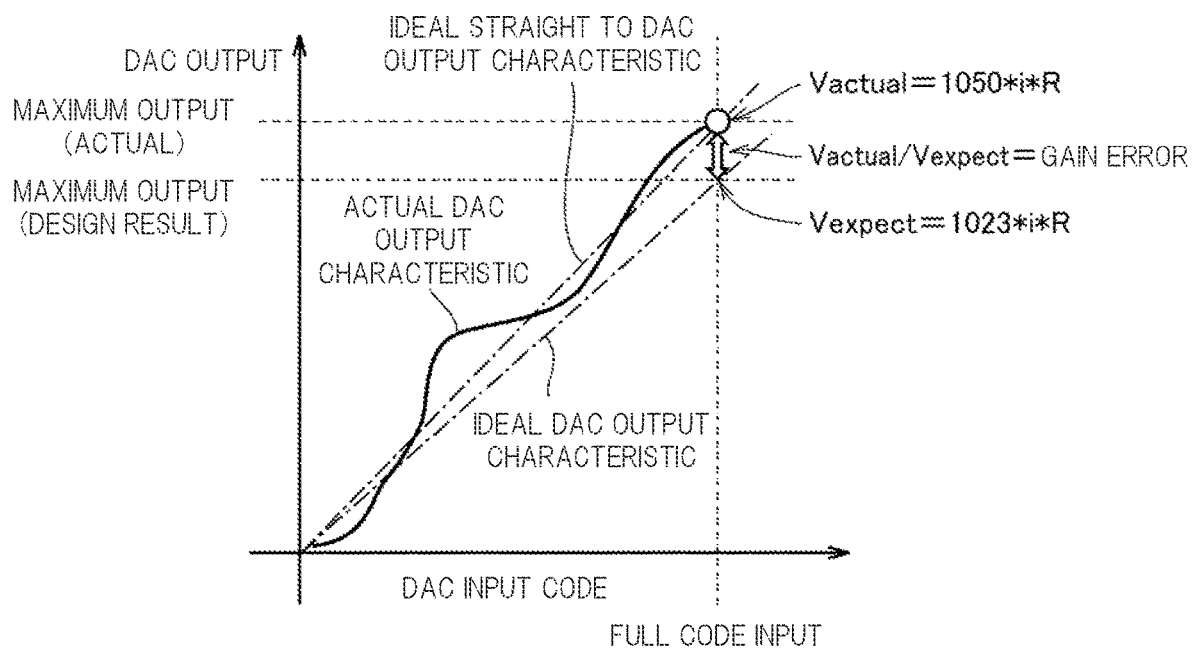
FIG. 20 is a diagram for explaining a gain error test of the DA converter according to the embodiment.

FIG. 20 is a diagram for explaining a gain error test of a DA converter according to the embodiment.

With reference to FIG. 20, shown is an ideal straight line according to the DAC output characteristic. Also, the actual DAC output is shown. Moreover, an ideal DAC output characteristic is shown.

A gain error indicates a deviation in gain between a straight line according to the ideal DAC output characteristic and a straight line according to the actual DAC output characteristic in the entire relationship between the analog input voltage of the DA converter and the digital output signal.

As one example, the maximum output in full codes and the maximum output as a design result in full codes are shown. If a degree of deviations is large in the comparison, this needs to be judged as defect in order that the performance of the DA converter is affected.

Figure 21:
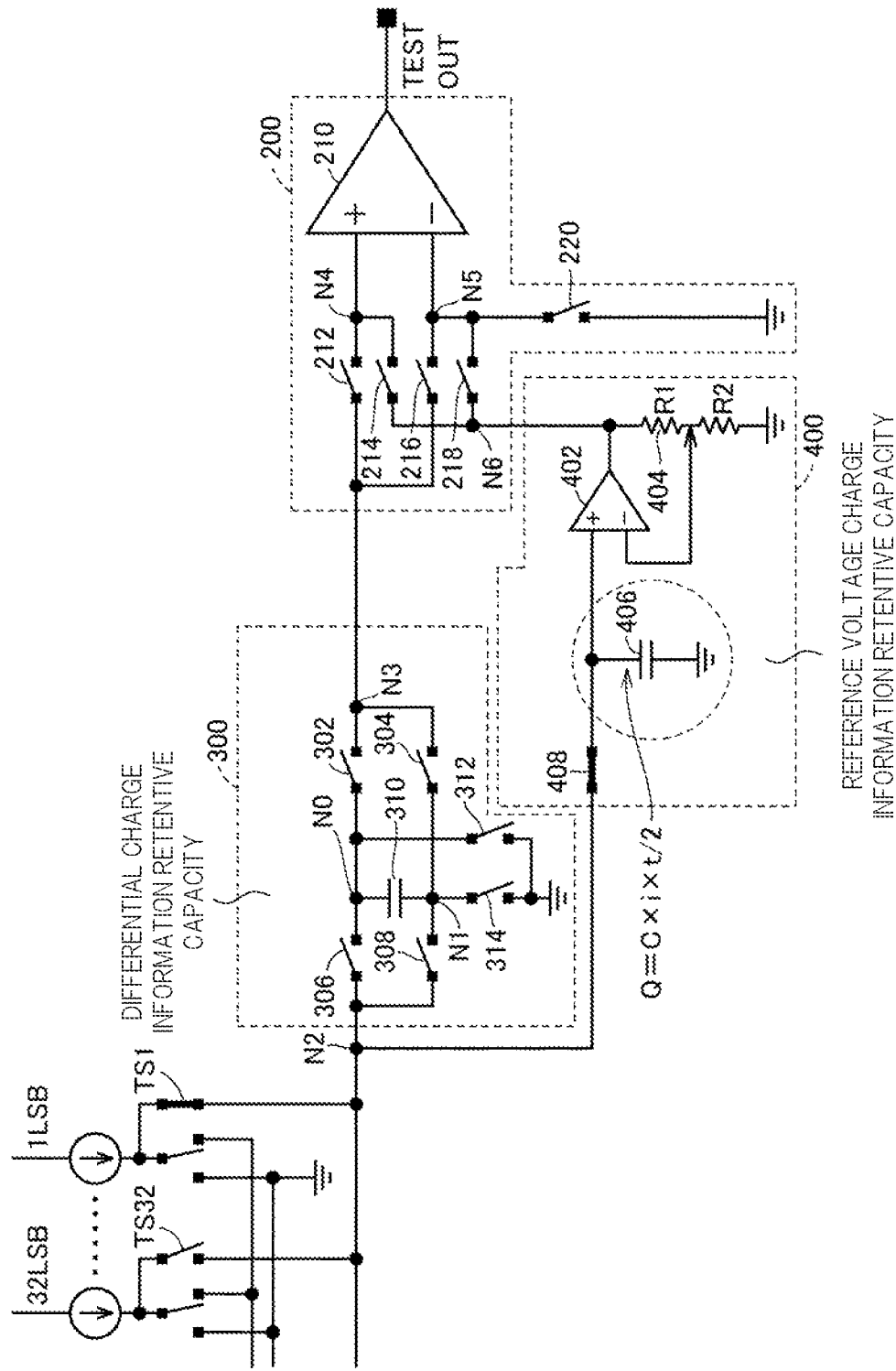
FIG. 21 is a diagram for explaining a case where the reference charge information is stored in the reference voltage generation circuit 400 according to the embodiment.

FIG. 21 is a diagram for explaining a case where reference charge information is stored in the reference voltage generation circuit 400 according to the embodiment. With reference to FIG. 21, after resetting a charge of the capacitor 406, a charge of the current source (1i) is stored as the reference charge information in the capacitor 406 by using the time t/2.

Specifically, the switch TS1 is turned on to connect the current cell of the current DAC 8 and the node N2. Further, the switch 408 is turned on to connect the node N2 and the capacitor 406. The other switches are turned off. At this point, the charge amount is adjusted by adjusting the on-time of the switch.

Specifically, the time for turning on the switch 408 is set to time t/2.

Consequently, the charge stored in the capacitor 406 is set to Q=C×i×t/2.

Figure 22:
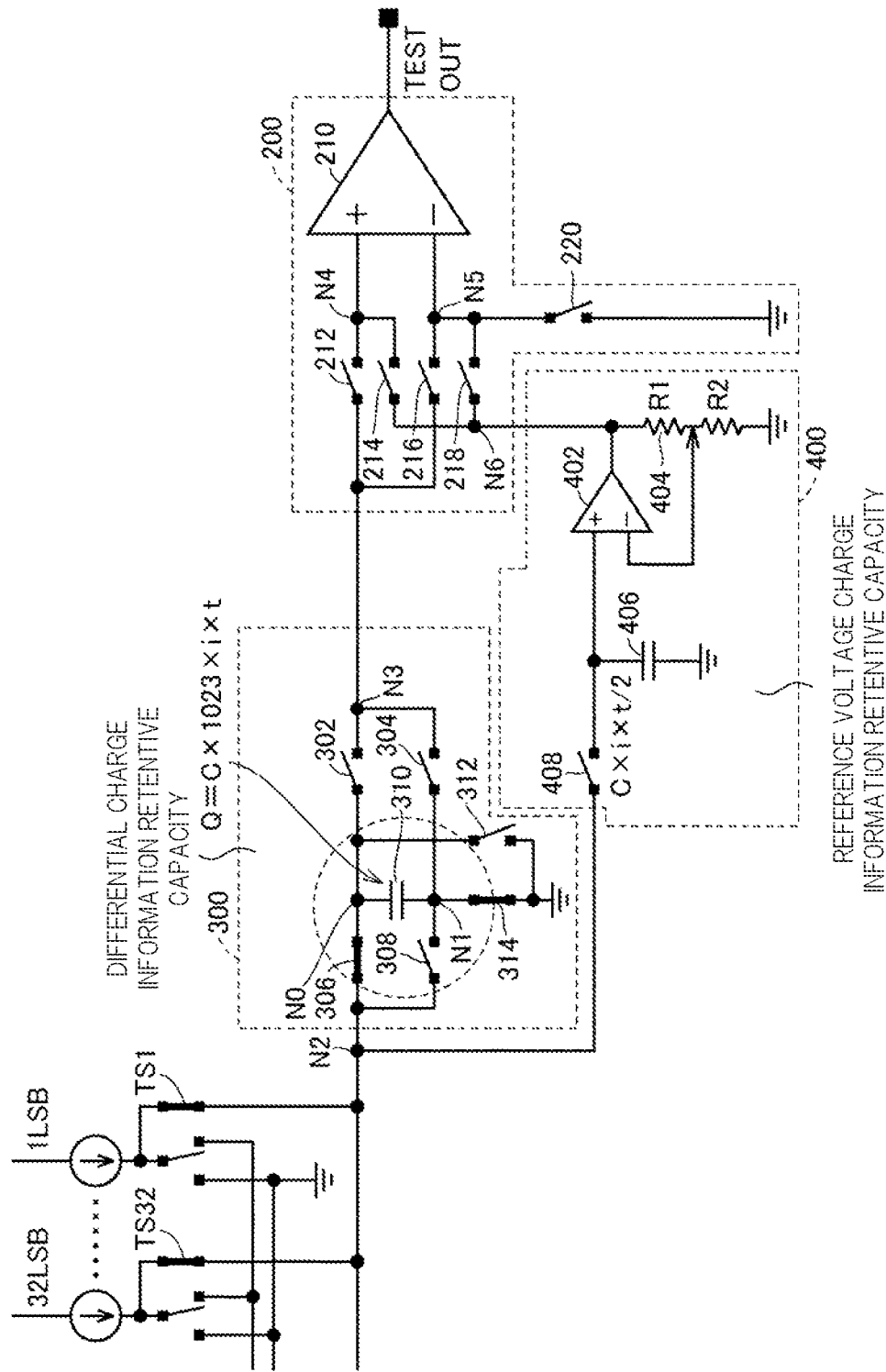
FIG. 22 is a diagram for explaining a case (No. 1) in which differential charge information is stored in the charge information holding circuit 300 at the gain error test according to the embodiment.

FIG. 22 is a diagram for explaining a case (No. 1) where the differential charge information is stored in the charge information holding circuit 300 in the gain error test according to the embodiment. With reference to FIG. 22, after resetting a charge of the capacitor 310, a charge of a current source (1023i) is accumulated as charge information in the capacitor 310 by using the time t.

Specifically, all the switches TS1 and T32, etc. are turned on to connect all the current cells (1023LSB) of the current DAC 8 and the node N2. Further, the switch 306 is turned on to connect the node N2 and the node N0 side of the capacitor 310. Furthermore, the switch 314 is turned on to connect the node N1 side of the capacitor 310 and the fixed voltage VSS. The other switches are turned off.

Also, the charge amount is adjusted by adjusting the on-time of the switch.

Specifically, the time for turning on the switches 306, 314 is set to the time t.

Consequently, the charge stored in the capacitor 310 is set to Q=C×1023i×t.

Figure 23:
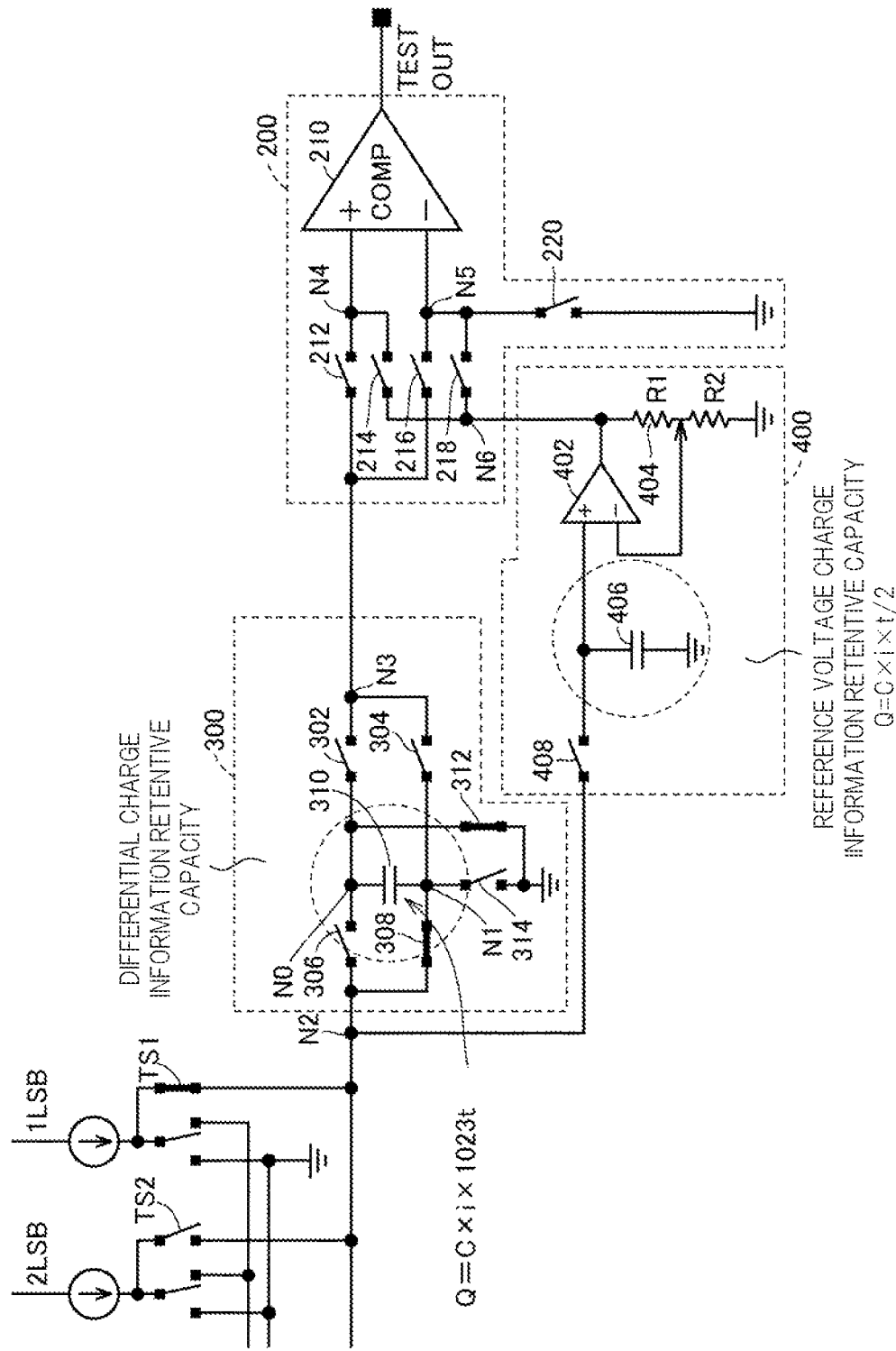
FIG. 23 is a diagram (No. 2) for explaining a case where the differential charge information is stored in the charge information holding circuit 300 at the gain error test according to the embodiment.

FIG. 23 is a diagram (No. 2) for explaining a case where the differential charge information is stored in the charge information holding circuit 300 in the gain error test according to the embodiment. With reference to FIG. 23, the differential charge information is then stored in the capacitor 310.

Specifically, the switch TS1 is turned on to connect the 1LSB current cell and the node N2. Further, the switch 308 is turned on to connect the node N2 and the node N1 side of the capacitor 310. Furthermore, the switch 312 is turned on to connect the node N0 side of the capacitor 310 and the fixed voltage VSS. The other switches are turned off.

Also, the charge amount is adjusted by adjusting the on-time of the switch.

Specifically, each time for turning on the switches 308, 312 is set to the time 1023t.

Consequently, the charge accumulated in the capacitor 310 from the node N1 side of the capacitor 310 is set to $Q=C \times i \times 1023t$.

Therefore, the differential charge information is accumulated as the charge information of the capacitor 310.

That is, as described in FIG. 20, accumulated is a difference between a charge accumulated according to an ideal straight line in performing a full code input and a charge accumulated according to the actual DAC output characteristic.

Figure 24:
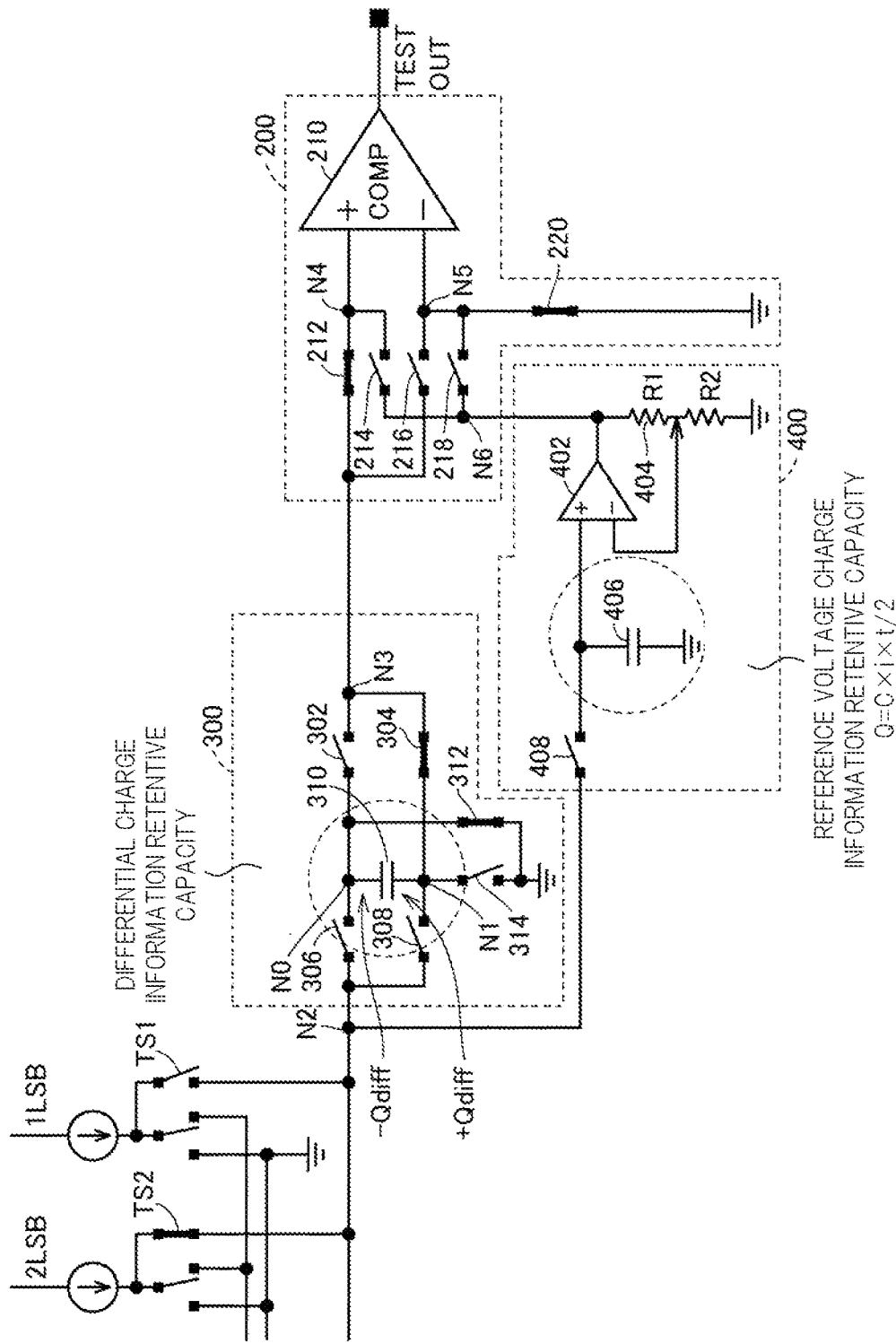
FIG. 24 is a diagram for explaining determination of the polarity of the differential charge information at the gain error test according to the embodiment.

FIG. 24 is a diagram for explaining determination of a polarity of the differential charge information at the gain error test according to the embodiment. With reference to FIG. 24, as the differential charge information, the node N1 side of the capacitor 310 is set to +Qdiff and the node N0 side is set to −Qidiff. The switch 304 is turned on to connect the node N1 and the node N3. The switch 312 is turned on to connect the node N0 and the fixed voltage VSS.

Also, the switch 212 of the comparison circuit 200 is turned on to connect the node N3 and the node N4. Further, the switch 220 of the comparison circuit 200 is turned on to connect the node N5 and the fixed voltage VSS. The other switches are turned off.

Consequently, the input node N4 of the comparator 210 receives the input of the voltage according to the charge stored in the capacitor 310. Further, the input node N5 of the comparator 210 is connected to the fixed voltage VSS.

The comparator 210 outputs an "H" level if the voltage of the input node N4 of the comparator 210 is larger than the fixed voltage VSS (0 V as an example). The comparator 210 outputs an "L" level if the voltage of the input node N4 of the comparator 210 is smaller than the fixed voltage VSS (0 V as an example).

That is, the output of the comparator 210 makes it possible to determine the polarity of the capacitor 310. When the output of the comparator 210 is at the "H" level, this indicates that the accumulated charge based on the ideal straight line in performing the full code input is accumulated more than the charge accumulated by the actual DAC output characteristic. In other words, shown is a case where the gain characteristic of the actual DAC output characteristic is lower than the gain characteristic based on the ideal straight line. In this case, the spec lower limit test of the gain error is conducted.

Meanwhile, when the output of the comparator 210 is at the "L" level, this indicates that the charge based on the ideal straight line in performing the full code input is accumulated less than the charge accumulated by the actual DAC output characteristic. In other words, shown is a case where the gain characteristic of the actual DAC output characteristic is higher than the gain characteristic based on the ideal straight line. In this case, the spec upper limit test of the gain error is conducted.

Figure 25:
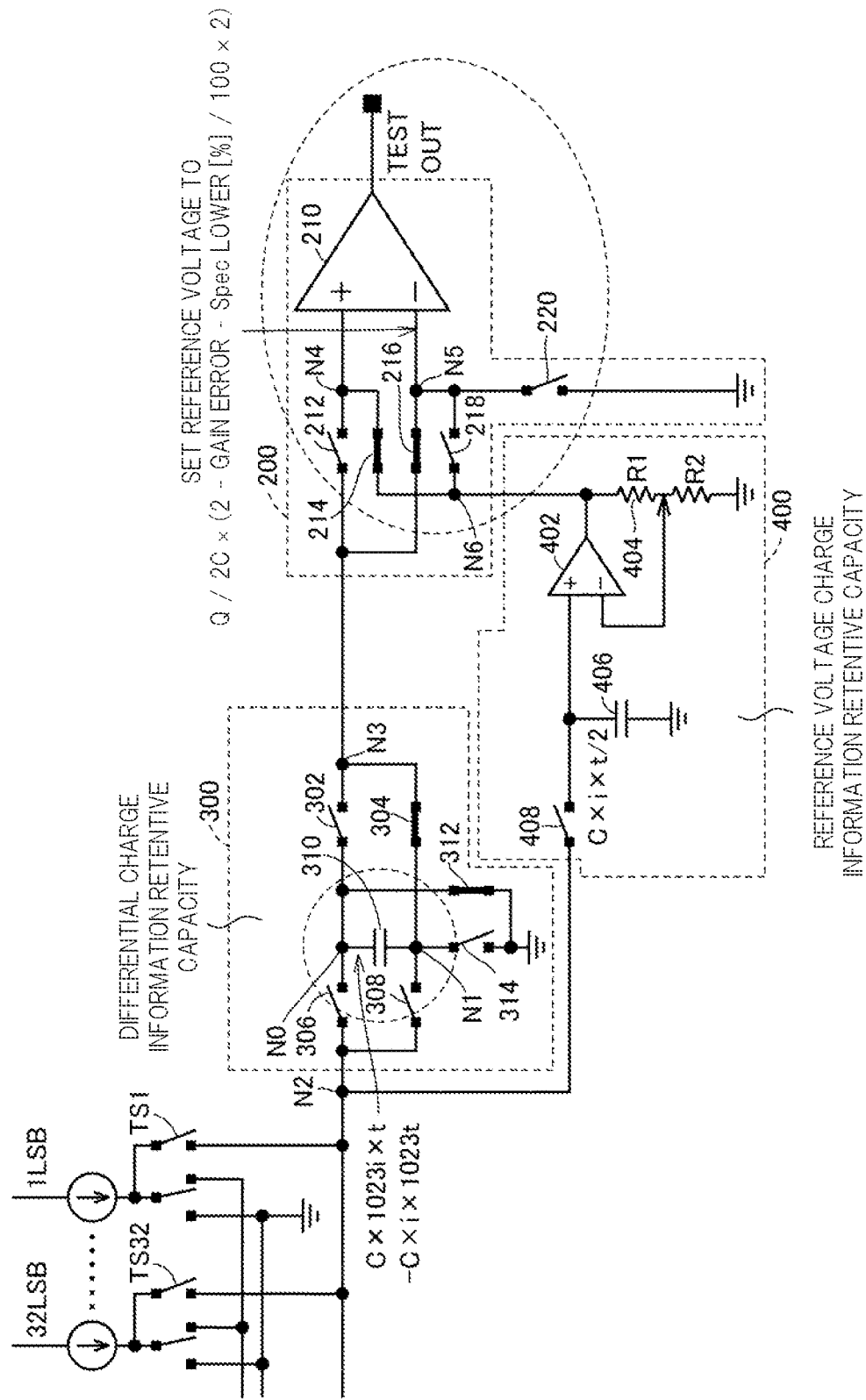
FIG. 25 is a diagram for explaining a gain error spec lower limit test according to the embodiment.

FIG. 25 is a diagram for explaining a gain error spec lower limit test according to the embodiment. A gain error spec lower limit test will be described with reference to FIG. 25. The switch 304 is turned on to connect the node N1 and the node N3. The switch 312 is turned on to connect the node N0 and the fixed voltage VSS.

Also, the switch 212 of the comparison circuit 200 is turned on to connect the node N3 and the node N4. Further, the switch 218 of the comparison circuit 200 is turned on to connect the node N5 and the node N6. The other switches are turned off.

Consequently, the input node N4 of the comparator 210 receives the input of the voltage according to the charge stored in the capacitor 310. Further, the input node N5 of the comparator 210 is connected to the output node of the non-inverting amplifier 402.

The comparator 210 outputs an "H" level if the voltage of the input node N4 of the comparator 210 is larger than that of the input node N5. The comparator 210 outputs an "L" level if the voltage of the input node N4 of the comparator 210 is smaller than that of the input node N5.

That is, the voltage according to the charge stored in the capacitor 310 and the voltage of the gain error lower limit spec are compared, and it is determined whether the former voltage is larger than the latter voltage of the gain error lower limit spec.

The comparator 210 outputs an "H" level when the voltage according to the charge stored in the capacitor 310 is equal to or higher than the voltage of the gain error lower limit spec. Meanwhile, the comparator 210 outputs an "L" level when the voltage according to the charge stored in the capacitor 310 is less than the voltage of the gain error lower limit spec.

If the comparator 210 is at the "H" level, this is judged as OK, and if it is at the "L" level, this is judged as NG.

The reference voltage is set by adjusting the resistance value of the variable resistance element 404.

As one example, the reference voltage is set to Q/2C× (2−gain error spec lower limit/100×2).

The gain error spec lower limit is set within −10%. In this case, (2−gain error spec lower limit/100×2) is set to become 1.8 times.

Specifically, as one example, by setting a resistance ratio between the resistors R1 and R2 of the variable resistance element 404 to become 4:5, the non-inverting amplifier 402 outputs an output voltage VO that is 1.8 times the input voltage VI. This setting makes it possible to set the reference voltage of the gain error lower limit spec to −10%.

Figure 26:
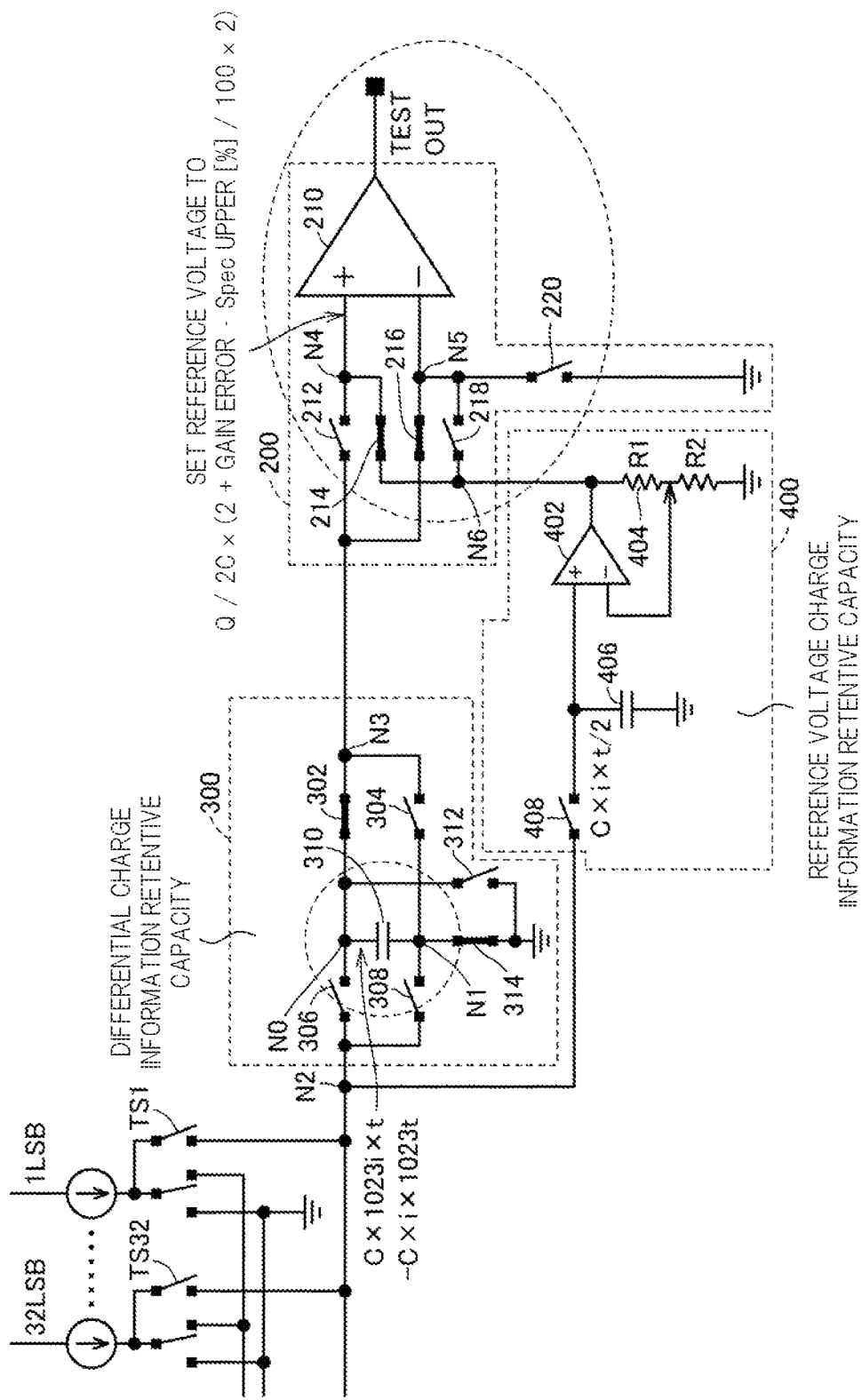
FIG. 26 is a diagram for explaining a gain error spec upper limit test according to the embodiment.

FIG. 26 is a diagram for explaining a gain error spec upper limit test according to the embodiment. A gain error spec upper limit test will be described with reference to FIG. 26. The switch 302 is turned on to connect the node N0 and the node N3. The switch 314 is turned on to connect the node N1 and the fixed voltage VSS.

Also, the switch 216 of the comparison circuit 200 is turned on to connect the node N3 and the node N5. Further, the switch 214 of the comparison circuit 200 is turned on to connect the node N4 and the node N6. The other switches are turned off.

Consequently, the input node N5 of the comparator 210 receives the input of the voltage according to the charge stored in the capacitor 310. Further, the input node N4 of the comparator 210 is connected to the output node of the non-inverting amplifier 402.

The comparator 210 outputs an "H" level if the voltage of the input node N4 of the comparator 210 is larger than that of the input node N5. The comparator 210 outputs an "L"

level if the voltage of the input node N4 of the comparator 210 is smaller than that of the input node N5.

That is, the voltage according to the charge stored in the capacitor 310 and the voltage of the gain error upper limit spec are compared, and it is determined whether the former voltage is smaller than the latter voltage of the gain error upper limit spec.

The comparator 210 outputs an "H" level when the voltage of the gain error upper limit spec is equal to or higher than the voltage according to the charge stored in the capacitor 310. Meanwhile, the comparator 210 outputs an "L" level when the voltage according to the charge stored in the capacitor 310 is larger than the voltage of the gain error upper limit spec.

If the comparator 210 is at the "H" level, this is judged as OK, and if the comparator 210 is at the "L" level, this is judged as NG.

The reference voltage is set by adjusting the resistance value of the variable resistance element 404.

As one example, the reference voltage is set to Q/2C× (2+gain error spec upper limit/100×2).

The gain error spec upper limit is set to +10% or less. In this case, it is set to be 2.2 times (2+gain error spec lower limit/100×2).

Specifically, as one example, by setting the resistance ratio between the resistors R1 and R2 of the variable resistance element 404 to 6:5, the non-inverting amplifier 402 outputs an output voltage VO that is 2.2 times the input voltage VI. This setting makes it possible to set the reference voltage of the gain error spec upper limit to +10%.

Only the above-mentioned test is sufficient for the gain error spec upper limit test and lower limit test, and the test shifted by one code does not need to be conducted.

Incidentally, in this example, a case where the 10-bit counter 7 and the current DAC 8 have the same 10 bits has been described, but the present invention is not limited to this and different bits can be set. For example, a 12-bit counter 7 and a 10-bit current DAC 8 may be used.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
    a digital-analog converter provided with a plurality of current cells; and
    a test circuit electrically connected to the digital-analog converter, and testing the digital-analog converter,
    wherein the test circuit includes:
        a charge information holding circuit holding, as differential charge information, a difference value between a first charge according to a first current and a second charge according to a second current by at least one or more current cells among the plurality of current cells;
        a reference voltage generation circuit generating a reference voltage to be comparative object; and
        a comparison circuit comparing a determination voltage according to the differential charge information with the reference voltage to output a comparison result.

2. The semiconductor device according to claim 1, wherein the charge information holding circuit includes:
    a first capacitor having a first electrode and a second electrode opposing the first capacitor; and
    a switch capable of switching a current path connected to the first electrode of the first capacitor and according the first current to a current path connected to the second electrode of the capacitor and according to the second current.

3. The semiconductor device according to claim 2, wherein the test circuit changes the differential charge information held in the capacitor by adjusting a time for forming the current path between at least one or more current cells of the plurality of current cells and the first capacitor.

4. The semiconductor device according to claim 2, wherein the reference voltage generation circuit includes:
    a second capacitor; and
    a non-inverting amplifier circuit amplifying a holding voltage according to a charge held in the second capacitor to generate the reference voltage.

5. The semiconductor device according to claim 1, wherein the non-inverting amplifier circuit includes a variable resistance element connected to an input node, and
wherein an amplification factor is changed by adjusting a resistance value of the variable resistance element.

6. The semiconductor device according to claim 1, wherein the digital-analog converter and the test circuit are formed in a same semiconductor chip.

7. The semiconductor device according to claim 1, further comprising:
    an imaging element; and
    an analog-digital converter converting an analog signal from the imaging element into a digital signal,
    wherein the analog-digital converter receives an input of a comparison signal from the digital-analog converter.

8. A control method for a semiconductor device including a digital-analog converter provided with a plurality of current cells and a test circuit electrically connected to the digital-analog converter to test the digital-analog converter, the control method comprising:
    holding, as differential charge information, a difference value between a first charge according to a first current and a second charge according to a second current by at least one or more current cells among the plurality of current cells;
    generating a reference voltage to be comparative object; and
    comparing a determination voltage according to the differential charge information with the reference voltage to output a comparison result.

* * * * *